United States Patent
Hsiao et al.

(10) Patent No.: US 10,482,978 B2
(45) Date of Patent: Nov. 19, 2019

(54) READ VOLTAGE OPTIMIZATION METHOD, MEMORY STORAGE DEVICE AND MEMORY CONTROL CIRCUIT UNIT

(71) Applicant: Shenzhen EpoStar Electronics Limited CO., Shenzhen (CN)

(72) Inventors: Yu-Hua Hsiao, Hsinchu County (TW); Li-Hsun Liu, Taoyuan (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 16/048,366

(22) Filed: Jul. 30, 2018

(65) Prior Publication Data

US 2019/0279723 A1    Sep. 12, 2019

(30) Foreign Application Priority Data

Mar. 9, 2018 (TW) .................................. 107108154

(51) Int. Cl.
| | |
|---|---|
| *G11C 16/26* | (2006.01) |
| *G11C 11/56* | (2006.01) |
| *G11C 11/408* | (2006.01) |
| *G11C 16/08* | (2006.01) |
| *G11C 16/04* | (2006.01) |

(52) U.S. Cl.
CPC .......... *G11C 16/26* (2013.01); *G11C 11/4087* (2013.01); *G11C 11/5642* (2013.01); *G11C 16/08* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 8,159,881 | B2 | 4/2012 | Yang |
| 8,498,152 | B2 | 6/2013 | Alrod et al. |
| 9,025,393 | B2 | 5/2015 | Wu et al. |

(Continued)

FOREIGN PATENT DOCUMENTS

| | | |
|---|---|---|
| CN | 104616695 | 12/2017 |
| CN | 107527644 | 12/2017 |
| TW | 201501124 | 1/2015 |

OTHER PUBLICATIONS

Office Action of Taiwan Counterpart Application, dated Sep. 28, 2018, pp. 1-3.

*Primary Examiner* — J. H. Hur
(74) *Attorney, Agent, or Firm* — JCIPRNET

(57) ABSTRACT

A decoding method is provided. The method includes selecting a target word line among a plurality of word lines; respectively reading a plurality of target memory cells of the target word-line by using different X read voltage sets to obtain corresponding X Gray code summation sets; calculating a Gray code count summation difference of the Gray code count summations at the same sequence position respectively in N−1 Gray code count summations between every pair of adjacent Gray code summation sets of the X Gray code summation sets, so as to obtain X−1 Gray code count summation difference sets corresponding to all pairs of the Gray code summation sets; and deciding N−1 optimized read voltages from X*(N−1) read voltages belonging to the X read voltage sets according to the X−1 Gray code count summation difference sets.

26 Claims, 12 Drawing Sheets

(56) References Cited

U.S. PATENT DOCUMENTS

| | | | |
|---|---|---|---|
| 2010/0296350 A1* | 11/2010 | Kim | G11C 11/5642 365/189.15 |
| 2013/0003459 A1 | 1/2013 | Ulriksson et al. | |
| 2013/0148436 A1* | 6/2013 | Kurosawa | G11C 16/26 365/185.24 |
| 2014/0233309 A1* | 8/2014 | Shibata | G11C 16/26 365/185.03 |
| 2015/0029796 A1* | 1/2015 | Choi | G11C 11/5642 365/189.05 |
| 2018/0204624 A1* | 7/2018 | Yoon | G11C 16/28 |

* cited by examiner

FIG. 7

Gray code count summation 720

| SL$_{1,1}$ | SL$_{1,2}$ | SL$_{1,3}$ | SL$_{1,4}$ | SL$_{1,5}$ | SL$_{1,6}$ | SL$_{1,7}$ | } SL(1) ⎫
| SL$_{2,1}$ | SL$_{2,2}$ | SL$_{2,3}$ | SL$_{2,4}$ | SL$_{2,5}$ | SL$_{2,6}$ | SL$_{2,7}$ | } SL(2) ⎬ A9(1)
| SL$_{3,1}$ | SL$_{3,2}$ | SL$_{3,3}$ | SL$_{3,4}$ | SL$_{3,5}$ | SL$_{3,6}$ | SL$_{3,7}$ | } SL(2) ⎫ A9(2)
| ... |
| SL$_{x-1,1}$ | SL$_{x-1,2}$ | SL$_{x-1,3}$ | SL$_{x-1,4}$ | SL$_{x-1,5}$ | SL$_{x-1,6}$ | SL$_{x-1,7}$ | } SL(X−1) ⎫ A9(X−1)
| SL$_{x,1}$ | SL$_{x,2}$ | SL$_{x,3}$ | SL$_{x,4}$ | SL$_{x,5}$ | SL$_{x,6}$ | SL$_{x,7}$ | } SL(X)

Formula of gray code count summation difference 910

| DL$_{1,1}$ | DL$_{1,2}$ | DL$_{1,3}$ | DL$_{1,4}$ | DL$_{1,5}$ | DL$_{1,6}$ | DL$_{1,7}$ | } DL(1)
| DL$_{2,1}$ | DL$_{2,2}$ | DL$_{2,3}$ | DL$_{2,4}$ | DL$_{2,5}$ | DL$_{2,6}$ | DL$_{2,7}$ | } DL(2)
| ... |
| DL$_{x-1,1}$ | DL$_{x-1,2}$ | DL$_{x-1,3}$ | DL$_{x-1,4}$ | DL$_{x-1,5}$ | DL$_{x-1,6}$ | DL$_{x-1,7}$ | } DL(X−1)

Formula of gray code count summation difference: $DL_{i,j} = |SL_{i+1,j} - SL_{i,j}|$ DL(i) corresponds to VR(i) and VR(i+1)

FIG. 9

READ VOLTAGE OPTIMIZATION METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 107108154, filed on Mar. 9, 2018. The entirety of the above-mentioned patent application is hereby incorporated by reference herein and made a part of this specification.

BACKGROUND OF THE INVENTION

Field of the Invention

The invention relates to a decoding method, and particularly relates to a decoding method and a storage controller for a storage device having a rewritable non-volatile memory module.

Description of Related Art

In general, when data is read from a rewritable non-volatile memory module, if a page reading failure does not occur, the system may read the data based on a default read voltage set or an optimal read voltage set used previously. When a read failure occurs, the system (storage system) may stop using the default read voltage set or the optimal voltage used previously and correspondingly adjust the read voltage set.

In other words, the value of the optimal read voltage set of the rewritable non-volatile memory module is not fixed. However, conventional processes for adjusting the read voltage set to obtain the optimal read voltage set are resource-consuming. For example, in the first conventional read voltage optimization process, the sizes of a plurality of different read voltages corresponding to different threshold voltage distributions are constantly adjusted (e.g., a read voltage corresponding to a threshold distribution interface in a read voltage set is adjusted, and rest of the read voltages in the read voltage set are fixed) to read the data where the page reading failure occurs in attempt to obtain an optimal data reading result and set the read voltage set corresponding to the optimal data reading result in an optimized read voltage set corresponding to the physical unit storing the data. Taking a TLC flash memory (where one memory cell stores three bit values) as an example, a read voltage set would have a total of seven read voltages corresponding to different voltage intervals. According to a conventional process, six of the read voltages are fixed, and one of the read voltages is changed. If each read voltage requires X times of adjustment and the optimal reading voltage is obtained through reading and comparing all read voltages, it requires $(2^3-1)*X=7*X$ read counts to obtain the optimal read voltage. Besides, prior verified data are required for such conventional process. In other words, this conventional process requires a large amount of computing resources (e.g., adjusting the read voltage and verifying corresponding read data) and storage space (e.g., the space for storing the verified data).

Alternatively, in a second conventional process, a plurality of adjustment read voltage sets set in advance in the hardware specification of a memory module are adapted to read the data and look for the optimal data reading result. Specifically, the read voltages in each of the adjustment read voltage sets cannot be set by the controller of the storage device, and the number of the adjustment read voltage sets is limited. In other words, based on the second conventional process, it may be possible to find one of the adjustment read voltage sets by which the data is correctly read (i.e., successfully decoded). However, the adjustment read voltage set found may not be the optimal read voltage set that meets the current threshold voltage, such as the one found in the first conventional process. Due to the limited number of adjustment read voltage sets and the lower accuracy as compared to the first conventional process, there may be a circumstance where none of the adjustment read voltage set reads the data correctly for the second conventional process.

In other words, while the second conventional process is able to find out the read voltage set that renders correct data in a more efficient manner than the first conventional process, the chance of failure for the second conventional process is also higher than the chance of the first conventional process. In addition, the number of error bits in the read data may also be higher, which reduces the efficiency of the decoding operation.

Thus, to quickly and efficiently obtain the optimized read voltage without the verified data to facilitate the reading efficiency of the rewritable non-volatile memory module is an issue to work on.

SUMMARY OF THE INVENTION

The present invention provides a decoding method (also known as a read voltage optimization method) and a storage controller capable of quickly and efficiently obtain an accurate optimized read voltage set without the preparation of verified data. Accordingly, data is read correctly by using a plurality of optimized read voltages of the optimized read voltage set.

An embodiment of the invention provides a decoding method for a storage device including a rewritable non-volatile memory module. The rewritable non-volatile memory module includes a plurality of word lines, each of the word lines includes a plurality of memory cells, each of the memory cells is programmed to store a bit value corresponding to one of a plurality of different Gray codes, a total number of the Gray codes is N, and N is a first predetermined positive integer greater than 2. The method includes the following. A target word line of the word lines is chosen. In addition, a plurality of target memory cells of the target word line are programmed. The target memory cells are respectively read by using different X read voltage sets to obtain corresponding X Gray code summation sets. X is a second predetermined positive integer. The X read voltage sets and the corresponding X Gray code summation sets are arranged based on a first predetermined order. A voltage difference between every pair of adjacent read voltage sets in the X read voltage sets is a predetermined voltage difference. Each of the X read voltage sets has N−1 read voltages arranged based on a second predetermined order. Each of the X Gray code summation sets has N−1 Gray code count summations arranged based on the second predetermined order. A $j^{th}$ Gray code count summation in the N−1 Gray code count summations corresponds to a $j^{th}$ read voltage in the N−1 read voltages. Values of j include 1 to N−1 based on the second predetermined order. Every pair of adjacent Gray code summation sets in the X gray code summation sets is chosen based on the first predetermined order. A Gray code count summation difference of the Gray code count summations at the same sequence position in the respective N−1 Gray code count summations between every chosen pair of two Gray code summation sets is calculated based on the second predetermined order to obtain X−1 Gray code count summation difference sets corresponding to all the chosen pairs of the Gray code summation sets. Each of the X−1 Gray code count summation difference sets includes N−1 Gray code count summation differences arranged based on the second predetermined order, and a $j^{th}$ Gray code count summation difference in the N−1 Gray code count summation differences corresponds to the $j^{th}$ read voltage in the N−1 read voltages. N−1 optimized read voltages corresponding to the second predetermined order are determined from X*(N−1) read voltages belonging to the X read voltage sets based on the N−1 Gray code count summation differences of each of the X−1 Gray code count summation difference sets to form an optimized read voltage set corresponding to the target word line.

An embodiment of the invention provides a storage controller. The storage controller controls a storage device including a rewritable non-volatile memory module. The storage controller includes a connection interface circuit, a memory interface control circuit, a read voltage management circuit unit, and a processor. The connection interface circuit is coupled to a host system. The memory interface control circuit is coupled to the rewritable non-volatile memory module. The rewritable non-volatile memory module includes a plurality of word lines. Each of the word lines includes a plurality of memory cells. Each of the memory cells is programmed to store a bit value corresponding to one of a plurality of different Gray codes. A total number of the Gray codes is N, and N is a first predetermined positive integer greater than 2. The processor is coupled to the connection interface circuit, the memory interface control circuit, and the read voltage management circuit unit. The processor chooses a target word line of the word lines and instructs the read voltage management circuit unit to perform a read voltage optimization operation corresponding to the target word line. A plurality of target memory cells of the target word line are programmed. In the read voltage optimization operation, the read voltage management circuit unit respectively reads the target memory cells by using different X read voltage sets to obtain corresponding X Gray code summation sets. X is a second predetermined positive integer. The X read voltage sets and the corresponding X Gray code summation sets are arranged based on a first predetermined order. A voltage difference between every pair of adjacent read voltage sets in the X read voltage sets is a predetermined voltage difference. Each of the X read voltage sets has N−1 read voltages arranged based on a second predetermined order. Each of the X Gray code summation sets has N−1 Gray code count summations arranged based on the second predetermined order, and a $j^{th}$ Gray code count summation in the N−1 Gray code count summations corresponds to a $j^{th}$ read voltage in the N−1 read voltages. In addition, the read voltage management circuit unit further chooses every pair of adjacent Gray code summation sets in the X gray code summation sets based on the first predetermined order, and calculates a Gray code count summation difference of the Gray code count summations at the same sequence position in the respective N−1 Gray code count summations between every chosen pair of two Gray code summation sets based on the second predetermined order to obtain X−1 Gray code count summation difference sets corresponding to all the chosen pairs of the Gray code summation sets. Each of the X−1 Gray code count summation difference sets includes N−1 Gray code count summation differences arranged based on the second predetermined order, and a $j^{th}$ Gray code count summation difference in the N−1 Gray code count summation differences corresponds to the $j^{th}$ read voltage in the N−1 read voltages. The read voltage management circuit unit further determines N−1 optimized read voltages corresponding to the second predetermined order from X*(N−1) read voltages belonging to the X read voltage sets based on the N−1 Gray code count summation differences of each of the X−1 Gray code count summation difference sets to form an optimized read voltage set corresponding to the target word line and complete the read voltage optimization operation corresponding to the target word line.

Based on the above, the decoding method and the storage controller according to the embodiments of the invention are capable of performing the read voltage optimization process corresponding to the target word line to any target word line without preparing verified data. In the read voltage optimization process, the storage controller adjusts the different read voltage sets to obtain the different Gray code count summation differences, so as to determine the optimized read voltages from the read voltages in the read voltage sets and form the optimized read voltage set corresponding to the target word line. Accordingly, the accuracy of the read data and the overall efficiency of the read operation are facilitated.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

FIG. 7 is a schematic diagram illustrating a statistics table recording Gray code counts, corresponding Gray code count summations, and Gray code summation sets (second predetermined order) according to an embodiment of the invention.

FIG. 9 is a schematic diagram illustrating a statistics table recording Gray code count summation and corresponding Gray code count summation differences (second predetermined order) according to an embodiment of the invention.

DESCRIPTION OF EMBODIMENTS

In the present embodiment, a storage device includes a rewritable non-volatile memory module and a storage device controller (which is also referred to as a storage controller or a storage control circuit). Moreover, the storage device is used together with a host system, and the host system may write data into the storage device or read data from the storage device.

Figure 1:
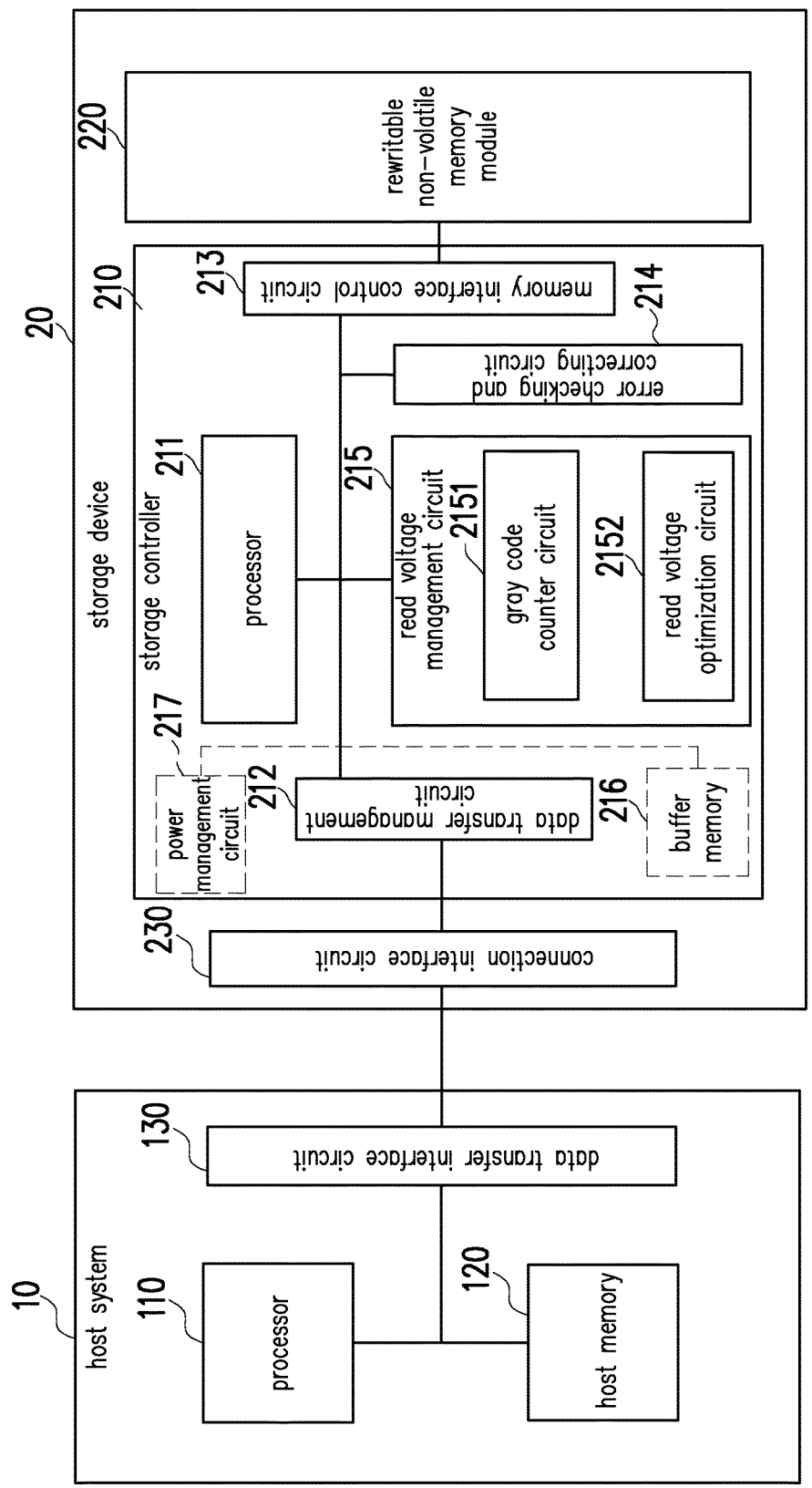
FIG. 1 is a block diagram of a host system and a storage device according to an embodiment of the invention.

FIG. 1 is a block diagram of a host system and a storage device according to an embodiment of the invention.

Referring to FIG. 1, the host system 10 includes a processor 110, a host memory 120 and a data transfer interface circuit 130. In the present embodiment, the data transfer interface circuit 130 is coupled (i.e., electrically connected to) the processor 110 and the host memory 120. In another embodiment, the processor 110, the host memory 120 and the data transfer interface circuit 130 are coupled to each other through a system bus.

The storage device 20 includes a storage controller 210, a rewritable non-volatile memory module 220 and a connection interface circuit 230. The storage controller 210 includes a processor 211, a data transfer management circuit 212 and a memory interface control circuit 213.

In the present embodiment, the host system 10 is coupled to the storage device 20 through the data transfer interface circuit 130 and the connection interface circuit 230 of the storage device 20 to implement a data access operation. For example, the host system 10 may store data to the storage device 20 or read data from the storage device 20 through the data transfer interface circuit 130.

In the present embodiment, the processor 110, the host memory 120 and the data transfer interface circuit 130 may be disposed on a motherboard of the host system 10. The number of the data transfer interface circuit 130 may be one or plural. Through the data transfer interface circuit 130, the motherboard may be coupled to the storage device 20 through a wired or wireless manner. The storage device 20 is, for example, a flash drive, a memory card, a solid state disk (SSD) or a wireless memory storage device. The wireless memory storage device is, for example, a memory storage device based on various wireless communication techniques such as a near field communication (NFC) memory storage device, a WiFi memory storage device, a Bluetooth memory storage device or a low power consumption Bluetooth memory storage device (for example, iBeacon), etc. Moreover, the motherboard may also be coupled to a global positioning system (GPS) module, a network interface card, a wireless transmission device, or various I/O devices such as a keyboard, a screen, a mouse, a loudspeaker, etc., through the system bus.

In the present embodiment, the data transfer interface circuit 130 and the connection interface circuit 230 are interface circuits compatible to a peripheral component interconnect express (PCI express) standard. Moreover, a fast non-volatile memory interface express (NVMe) is a communication protocol used to transmit data between the data transfer interface circuit 130 and the connection interface circuit 230.

However, it should be noted that the invention is not limited thereto, and the data transfer interface circuit 130 and the connection interface circuit 230 may also be compliant with a Parallel Advanced Technology Attachment (PATA) standard, an Institute of Electrical and Electronics Engineers (IEEE) 1394 standard, a Serial Advanced Technology Attachment (SATA) standard, a Universal Serial Bus (USB) standard, a SD interface standard, an Ultra High Speed-I (UHS-I) interface standard, an Ultra High Speed-II (UHS-II) interface standard, a Memory Stick (MS) interface standard, a Multi-Chip Package interface standard, a Multi Media Card (MMC) interface standard, an eMMC interface standard, a Universal Flash Storage (UFS) interface standard, an eMCP interface standard, a CF interface standard, an Integrated Device Electronics (IDE) standard or other suitable standards. Moreover, in another embodiment, the connection interface circuit 230 and the storage controller 210 may be packaged in one chip, or the connection interface circuit 230 is disposed outside a chip containing the storage controller 210.

In the present embodiment, the host memory 120 is used for temporarily storing a command or data executed by the processor 110. For example, in the present exemplary embodiment, the host memory 120 may be a dynamic random access memory (DRAM), a static random access memory (SRAM), etc. However, it should be noted that the invention is not limited thereto, and the host memory 120 may also be other suitable memory.

The storage controller 210 is used for executing a plurality of logic gates or control commands implemented in a hardware form or firmware form, and performing data writing, reading, and erasing operations on the rewritable non-volatile memory module 220 according to commands of the host system 10.

To be specific, the processor 211 of the storage controller 210 is hardware having computation capability and is used for controlling a whole operation of the storage controller 210. Specifically, the processor 211 has a plurality of control commands, and when the storage device 20 operates, the control commands are executed for the data writing, reading and erasing operations.

It should be noted that in the present embodiment, the processor 110 and the processor 211 are, for example, central processing units (CPU), microprocessors or other programmable microprocessors, digital signal processors (DSP), programmable controllers, application specific integrated circuits (ASIC), programmable logic devices (PLD) or other similar circuit devices, which are not limited by the invention.

In an embodiment, the storage controller 210 further has a read-only memory (not shown) and a random access memory (not shown). Particularly, the read-only memory has a boot code, and when the storage controller 210 is enabled, the processor 211 firstly executes the boot code to load the control commands stored in the rewritable non-volatile memory module 220 to the random access memory of the storage controller 210. Afterward, the processor 211 may execute the control commands to perform the data writing, reading and erasing operations. In another embodiment, the control commands of the processor 211 may also be stored in a specific area of the rewritable non-volatile memory module 220 (for example, a physical storage unit in the rewritable non-volatile memory module 220 used for storing system data) in form of program code.

In the present embodiment, as described above, the storage controller 210 further includes the data transfer management circuit 212 and the memory interface control circuit 213. It should be noted that the operations executed by the components of the storage controller 210 may also be regarded as operations executed by the storage controller 210.

The data transfer management circuit 212 is coupled to the processor 211, the memory interface control circuit 213 and the connection interface circuit 230. The data transfer management circuit 212 is used for receiving instructions of the processor 211 to implement data transfer. For example, data is read from the host system 10 (for example, the host memory 120) through the connection interface circuit 230, and the read data is written into the rewritable non-volatile memory module 220 through the memory interface control circuit 213 (for example, the writing operation is performed according to a writing command coming from the host system 10). For another example, data may be read from one or more physical units of the rewritable non-volatile memory module 220 (the data may be read from one or more memory cells of the one or more physical units) through the memory interface control circuit 213, and the read data is written to the host system 10 (for example, the host memory 120) through the connection interface circuit 230 (for example, the reading operation is performed according to a reading command coming from the host system 10). In another embodiment, the data transfer management circuit 212 may also be integrated into the processor 211.

The memory interface control circuit 213 receives an instruction of the processor 211, and performs the writing (also referred to as programming) operation, reading operation or erasing operation to the rewritable non-volatile memory module 220 in collaboration with the data transfer management circuit 212.

For example, the processor 211 may execute a writing command sequence to instruct the memory interface control circuit 213 to write data to the rewritable non-volatile memory module 220. The processor 211 may execute a reading command sequence to instruct the memory interface control circuit 213 to read data from one or more physical units (also referred to as target physical units), corresponding to the reading command, of the rewritable non-volatile memory module 220. The processor 211 may execute an erasing command sequence to instruct the memory interface control circuit 213 to perform an erasing operation to the rewritable non-volatile memory module 220. The writing command sequence, the reading command sequence, and the erasing command sequence may respectively include one or more program codes or command codes and instruct to perform the corresponding writing, reading and erasing operation to the rewritable non-volatile memory module 220. In an embodiment, the processor 211 may also send other types of the command sequence to the memory interface control circuit 213 to execute the corresponding operation to the rewritable non-volatile memory module 220.

Moreover, the data to be written into the rewritable non-volatile memory module 220 is converted into a format that is acceptable to the rewritable non-volatile memory module 220 by the memory interface control circuit 213. To be specific, if the processor 211 is about to access the rewritable non-volatile memory module 220, the processor 211 may send the corresponding command sequences to the memory interface control circuit 213 to instruct the memory interface control circuit 213 to execute the corresponding operations. For example, the command sequences include the writing command sequence instructing to write data, the reading command sequence instructing to read data, the erasing command sequence instructing to erase data, and corresponding command sequences instructing various memory operations (for example, to change a plurality of default read voltage values of a read voltage set or execute a garbage collection procedure, etc.). These command sequences may include one or more signals or data on a bus. These signals or data may include command codes or program codes. For example, the reading command sequence may include information of reading identification codes, memory addresses, etc.

The rewritable non-volatile memory module 220 is coupled to the storage controller 210 (the memory interface control circuit 213) and stores data written by the host system 10. The rewritable non-volatile memory module 220 may be a single level cell (SLC) NAND flash memory module (i.e., a flash memory module where one memory cell may store 1 bit), a multi level cell (MLC) NAND flash memory module (i.e., a flash memory module where one memory cell may store 2 bits), a triple level cell (TLC) NAND flash memory module (i.e., a flash memory module where one memory cell may store 3 bits), a quadruple level cell (QLC) NAND flash memory module (i.e., a flash memory module where one memory cell stores four bits) a 3D NAND flash memory module or a vertical NAND flash memory module, etc., or other memory modules having the same characteristics. The memory cells in the rewritable non-volatile memory module 220 are arranged in an array.

In the present embodiment, the rewritable non-volatile memory module 220 has a plurality of word lines, and each of the word lines includes a plurality of memory cells. The memory cells on the same word line may construct one or more physical programming units (physical pages). In addition, the physical programming units may form a physical unit (a physical block or a physical erasing unit). The present embodiment takes the TLC NAND flash memory module as an example. In other words, in the following embodiment, a memory cell that may store three bit values may serve as a physical programming unit (i.e., in each programming operation, a programming voltage is applied to one physical programming unit after another to program data). In addition, each of the respective memory cells may be divided into a lower physical page, a middle physical page, and an upper physical page, each storing one bit value.

In the embodiment, the memory cell is the smallest unit for data writing (programming). The physical unit is the smallest unit for erasing. In other words, each physical unit contains the minimum number of memory cells to be erased together. Each physical unit has a plurality of memory cells.

In the embodiment, system data recording information of a physical unit may be recorded in one or more memory cells in the physical unit or be recorded in one or more memory cells of a specific physical unit recording all system data in a system area. In the embodiment, the system data corresponding the physical unit includes information such as a program erase cycle (PEC), a data retention timestamp (DRP), a read counter value, etc., of the physical unit. More specifically, every time when the processor 211 performs the erasing operation to a physical unit, the processor 211 may add "1" to the PEC value of the corresponding physical unit when the erasing operation is completed. For example, the PEC value may add up from "0" along with each erasing operation. In other words, the program erase cycle value reflects the sum of times that the corresponding physical unit is erased. The data retention timestamp is used for instructing the time for which data is stored in the corresponding physical unit. Sizes of the timestamps (e.g., value differences) may reflect a temporal sequence. The invention does not intend to limit a detailed format of the timestamp. Every time when the writing operation is performed to the physical unit, the processor 211 may update the data retention timestamp of the physical unit to be the time at which the physical unit performs the writing operation. In other words, the data retention timestamp corresponding to a physical unit is used for indicating the time at which the latest writing operation is performed to the physical unit (e.g., local time when the latest writing operation is completed). The writing operation includes, for example, programming data to one or more memory cells of the physical unit, or, for example, programming data to another type of physical address of the physical unit. Then, the processor 211 may calculate how long the data in the physical unit has been stored since the previous writing operation based on the data retention timestamp. The read counter value serves to calculate the number of times that the corresponding physical unit is read, and the read counter value is reset when the corresponding physical unit is erased.

In the following embodiment, an example where one physical block serves as one physical unit is described. However, in another embodiment, one physical unit may also be formed by an arbitrary number of memory cells, depending on the practical needs. Besides, it should be understood that when the processor 211 groups the memory cells (or physical units) in the rewritable non-volatile memory module 220 to perform a corresponding management operation, the memory cells (or physical units) are logically grouped, while the physical positions of the memory cells remain the same.

For example, in the embodiment, the processor 211 may group a plurality of physical units into a plurality of physical unit groups based on statistical values of the physical units of the rewritable non-volatile memory module 220. The statistical value includes one of the program erase cycle, the data retention timestamp (also referred to as retention value) and the read counter value or a combination thereof. Physical units grouped into the same physical unit group may share similar physical properties. The processor 211 may read data from the physical units grouped into the same physical unit group based on the same read voltage set. For example, the same read voltage set is adapted to issue the read command sequence to perform the read operation to the physical units of the same physical unit group.

In other embodiments, the processor 211 may group the word lines of the rewritable non-volatile memory module 220 into a plurality of word line groups based on statistical values of the word lines (the processor 211 may calculate/sort the statistical values of the respective word lines), and the word lines grouped into the same word line group may have similar physical properties and thus can be read with the same read voltage set (i.e., the corresponding optimized read voltages) as in the previous embodiment. It should be noted that, in order to perform the read voltage optimization operation corresponding to each of the word lines (instead of each of the physical units) to each of the word lines, the following embodiment describes the read voltage optimization for each of the word lines and a read voltage optimization method for the operation. For an embodiment having multiple physical unit groups, the processor 211 may choose a word line of a physical unit from each of the physical unit groups to perform the read voltage optimization operation, or choose a physical unit from each of the physical unit groups to perform the read voltage optimization operation.

The storage controller 210 may assign a plurality of logical units to the rewritable non-volatile memory module 220. The host system 10 may access user data stored in the physical units through the assigned logical units. Here, each logical unit may be formed by one or more logical addresses. For example, the logical unit may be a logical block, a logical page, or a logical sector. Each logical unit may be mapped to one or more physical units. In addition, the logical unit may be one or more physical addresses, one or more physical sectors, one or more physical programming units, or one or more physical erasing units. In the embodiment, the logical unit is a logical block, and a logical sub-unit is a logical page. Each logical unit has a plurality of logical sub-units.

Besides, the storage controller 210 may build a logical to physical address mapping table and a physical to logical address mapping table to record the mapping relations between the logical units (e.g., logical blocks, logical pages, or logical sectors) assigned to the rewritable non-volatile memory module 220 and the physical units (e.g., physical erasing units, physical programming units, or physical sectors). In other words, the storage controller 210 may look for a physical unit mapped to a logical unit based on the logical to physical address mapping table, and the storage controller 210 may look up a logical unit mapped to a physical unit based on the physical to logical address mapping table. However, the technical concepts concerning mapping between the logical units and physical units are common technical means familiar to people having ordinary skills in the art. Thus, details in this regard will not be further described in the following.

In the embodiment, an error checking and correcting circuit 214 is coupled to the processor 211 and used for performing an error checking and correction operation to ensure the accuracy of data. Specifically, when the processor 211 receives a writing command from the host system 10, the error checking and correcting circuit 214 may generate a corresponding error correcting code (ECC) and/or error detecting code (EDC). In addition, the processor 211 may write the data and the corresponding ECC and/or EDC to the rewritable non-volatile memory module 220. Afterward, when reading data from the rewritable non-volatile memory module 220, the processor 211 may also read the ECC or EDC corresponding to the data, and the error checking and correcting circuit 214 may perform the error checking and correcting operation to the read data based on the ECC and/or EDC. Moreover, after the error checking and correcting operation, if the read data is successfully decoded, the error checking and correcting circuit 214 may return an error bit value to the processor 211.

In an embodiment, the storage controller 210 may further include a buffer memory 216 and a power management circuit 217. The buffer memory is coupled to the processor 211 and used for temporarily storing data and commands from the host system 10, data from the rewritable non-volatile memory module 220, or other system data used for managing the storage device 20. Accordingly, the processor 211 may quickly access the data, the command, or the system data from the buffer memory 216. The power management circuit 217 is coupled to the processor 211 and used for controlling power of the storage device 20.

In the embodiment, a read voltage management circuit unit 215 includes a Gray code counter circuit 2151 and a read voltage optimization circuit 2152. The read voltage management circuit unit 215 is used for managing read voltages of the word lines. More specifically, the processor 211 may choose a word line (also referred to as a target word line) of the word lines of the physical units of the rewritable non-volatile memory module 220 at a specific time point, and instruct the read voltage management circuit unit 215 to perform the read voltage optimization operation to the target word line. For example, the processor 211 may choose the target word line from the word lines to perform the read voltage optimization operation when: (1) the storage device 20 is idling (i.e., the storage device 20 is idling for over a predetermined threshold of time); (2) the storage device is turned on; or (3) when the number of error bits in data read from a word line exceeds an error bit threshold. Specifically, the processor 211 may choose a word line from a word line group whose physical state is less preferable (e.g., a word line group having more program erase cycles, a greater read counter value, a longer retention time, or a greater number of error bits) as the target word line based on one of the statistical values and error bit numbers of all the word line groups or a combination thereof. Besides, the processor 211 may also choose the target word line based on the number of error bits returned by the error checking and correcting circuit 214. Specifically, a word line may be chosen when the number of error bits of data read from a word line exceeds an error bit threshold, and the word line may set as the target word line. It should be noted that the chosen target word line already stores data. In other words, data is already programmed in the target word line. Besides, if the read voltage optimization operation for the target word line is completed, the read voltage management circuit unit 215 may record a read voltage set corresponding to the target word line.

In an embodiment, the processor 211 may also randomly choose the target word line to perform the read voltage optimization operation. In another embodiment, the processor 211 may also perform the read voltage optimization operation to each of the word lines.

In the following, details concerning how the voltage management circuit unit 215 performs the read voltage optimization operation and the functions of the Gray code counter circuit 2151 and the read voltage optimization circuit 2152 are described with reference to the accompany drawings.

Figure 2:
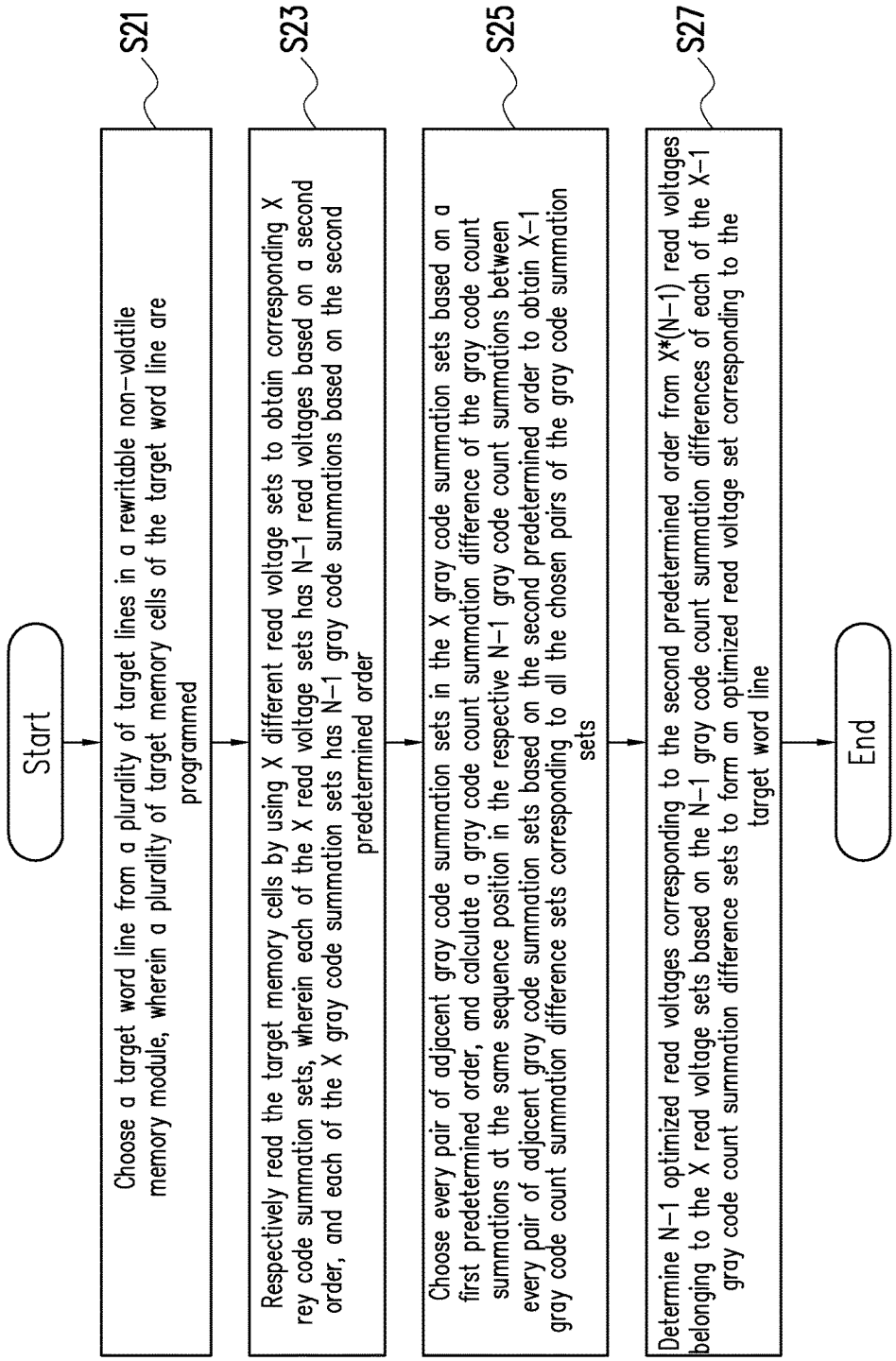
FIG. 2 is a flowchart illustrating a decoding method according to an embodiment of the invention.

FIG. 2 is a flowchart illustrating a read voltage optimization method according to an embodiment of the invention. Referring to FIGS. 1 and 2 at the same time, at Step S21, the processor 211 chooses the target word line among the word lines of the rewritable non-volatile memory module. A plurality of target memory cells in the target word line are already programmed.

Assuming that the processor 211 currently performs the read voltage optimization operation to one (also referred to as a target word line group) of the word line groups, the processor 211 may first choose the target word line to which the read voltage optimization operation is performed. The target word line may be chosen from the word lines of the target word line group based on a predetermined selection condition. The predetermined selection condition includes: (1) the target word line having a statistical value close to an average of the statistical values of all the word lines of the word line group to which the target word line belongs; (2) the target word line having the number of error bits that is the minimum among all the word lines of the word line group to which the target word line belongs; or (3) a word line being randomly chosen as the target word line.

In the embodiment, data is stored in the target word line. Specifically, each memory cell of each word line is programmed to store a bit value corresponding to one of a plurality of different Gray codes. The total number of the Gray codes is N, and N is a first predetermined positive integer greater than 2. In other words, the memory cells of the target word line may store bit values respectively corresponding to different Gray codes. In the following, details of the Gray codes are described with reference to FIG. 3.

Figure 3:
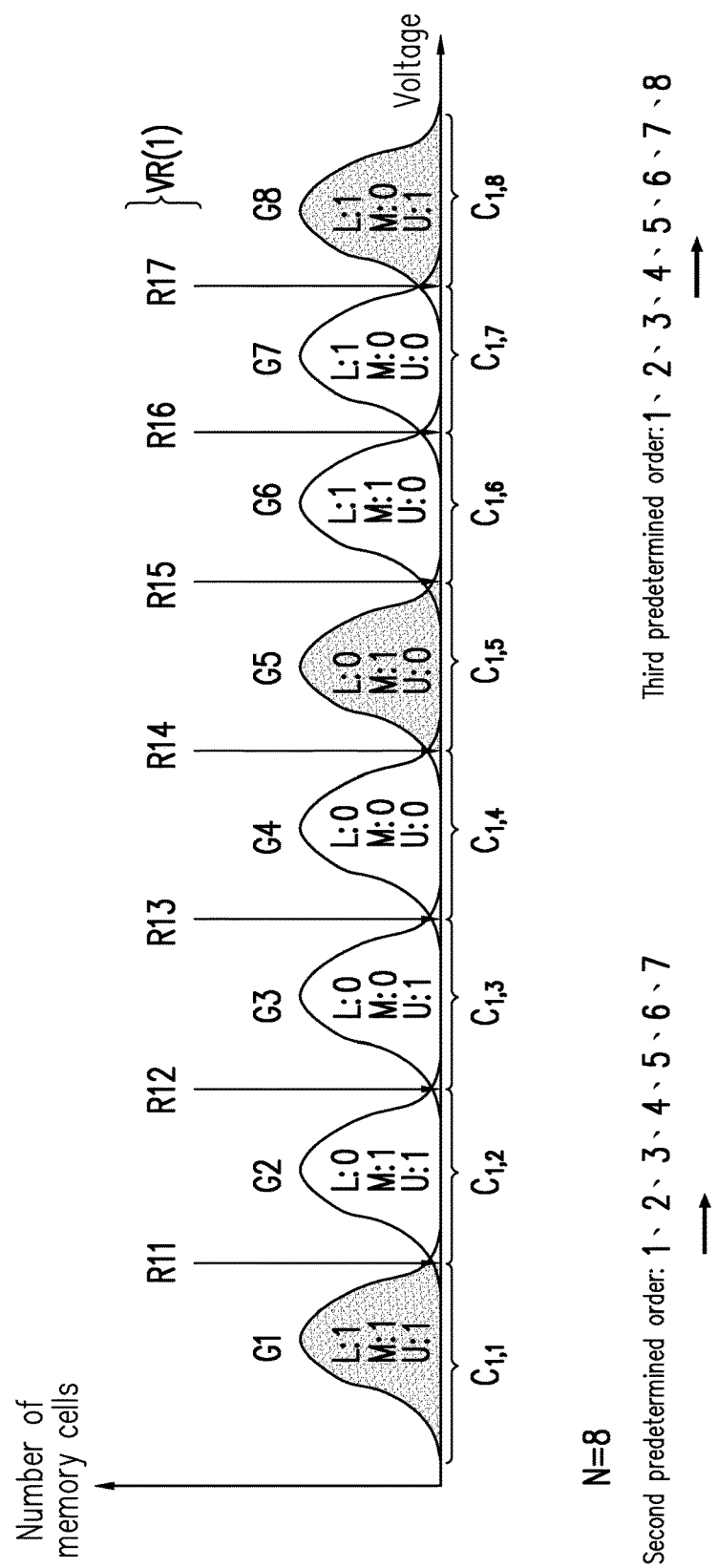
FIG. 3 is a graph illustrating threshold voltage distributions of a plurality memory cells read by the first read voltage set and corresponding to bit values of N Gray code and a plurality of corresponding Gray code counts according to an embodiment of the invention.

FIG. 3 is a graph illustrating threshold voltage distributions of a plurality memory cells read by the first read voltage set and corresponding to bit values of N Gray code and a plurality of corresponding Gray code counts according to an embodiment of the invention. The embodiment is described with an example of the TLC NAND flash memory module, N is 8 (i.e., $2^3$). Each memory cell of the TLC NAND flash memory module has three physical pages to respectively store bit data. Each memory cell includes a lower physical page (L), a middle physical page (M), and an upper physical page (U), each storing one bit value. Also, it is assumed that the processor 211 reads the memory cells (target memory cells) of the target word line of the TLC NAND flash memory module based on a plurality of read voltages R11 to R17 of the first read voltage set VR(1) and thereby identifies different bit values (bit values corresponding to different Gray codes) stored in the memory cells, and gate voltages in the respective memory cells may be classified into eight Gray codes, i.e., "L:1 M:1 U:1", "L:0 M:1 U:1", "L:0 M:0 U:1", "L:0 M:0 U:0", "L:0 M:1 U:0", "L:1 M:1 U:0", "L:1 M:0 U:0", and "L:1 M:0 U:1" (L: the bit value of the lower physical page, M: the bit value of the middle physical page, U: the bit value of the upper physical page) based on the read voltages R11 to R17 in the first read voltage set. The eight Gray codes may also be represented as eight bit value combinations, i.e., "111", "011", "001", "000", "010", "110", "100", and "101". The bit values in each of the bit value combinations are represented in the order of upper, middle, and lower physical pages. In other words, by respectively applying the read voltages R11 to R17 having different voltage values in the first read voltage set VR(1) to one of the memory cells of the target word line, the processor 211 may determine whether the channel of the memory cell is turned on and thereby respectively determine that the bit values (also referred to as bit data or read bit values) stored in the memory cell correspond to one of the different Gray codes (i.e., "111", "011", "001", "000", "010", "110", "100", and "101"). In other words, the bit values are read from one of the memory cells of the target word line based on the first read voltage set VR(1). For example, the read voltage R11 may distinguish between the Gray code "111" and the Gray code "011" (the left of the read voltage R11 is a threshold voltage distribution corresponding to the Gray code "111", and the right of the read voltage R11 is a threshold voltage distribution corresponding to the Gray code "011"). It should be noted that, as the memory cells in the rewritable non-volatile memory module 220 may have a plural number of Gray codes (8 in the example described herein), the number of the read voltages in each read voltage set is the plural number of Gray codes minus 1 (7 in the example described herein, i.e., N−1=8−1=7).

It should be noted that, based on the type of the rewritable non-volatile memory module 220, N may be a predetermined positive integer greater than 2 (also referred to as the first predetermined positive integer). For example, if the rewritable non-volatile memory module 220 is an MLC NAND flash memory module, then N=4; if the rewritable non-volatile memory module 220 is an SLC NAND flash memory module, then N=2; and if the rewritable non-volatile memory module 220 is a QLC NAND flash memory module, then N=16.

It should be noted that, in the embodiment, the threshold voltage distributions of the memory cells of the word line may deviate from default threshold voltage distributions. Due to the deviation of the threshold voltage distributions, a default read voltage set corresponding to the default threshold voltages is no longer suitable for reading the word line whose threshold voltage distributions are deviated. The processor 211 needs to additionally find a plurality of read voltages corresponding to the target word line, such that each of the read voltages may be respectively close to the interface between two corresponding adjacent threshold voltage distributions. The read voltages found accordingly may form a read voltage set as an optimized read voltage set of the target word line.

Referring to FIG. 2, at Step S23, the read voltage management circuit unit 215 uses different X read voltage sets to respectively read the target memory cells and thereby obtain corresponding X Gray code summation sets. In addition, each of the X read voltage sets has N−1 read voltages arranged based on the second predetermined order (e.g., based on the voltage size, left to right, $i^{th}$ to N−$1^{th}$, wherein N is 8, for example), and each of the X Gray code summation sets has N−1 Gray code count summations arranged in the second predetermined order. X is the second predetermined positive integer, and the X read voltage sets and the corresponding X Gray code summation sets are arranged in the first predetermined order. A voltage difference between every pair of adjacent read voltage sets in the X read voltage sets is the first predetermined voltage difference. The $j^{th}$ Gray code count summation of the N−1 Gray code count summations corresponds to the $j^{th}$ read voltage in the N−1 read voltages. The values of j include 1 to N−1 based on the second predetermined order. The values of the second predetermined positive integer (i.e., X) and the first predetermined voltage difference may be set in advance in the factory setting. It should be noted that, in the embodiment, the target memory cells of the target word line are all the memory cells of the target word line for storing arbitrary data. However, the invention is not limited thereto. For example, in another embodiment, the target memory cells are some memory cells of all the memory cells of the target word line for storing arbitrary data.

Figure 4:
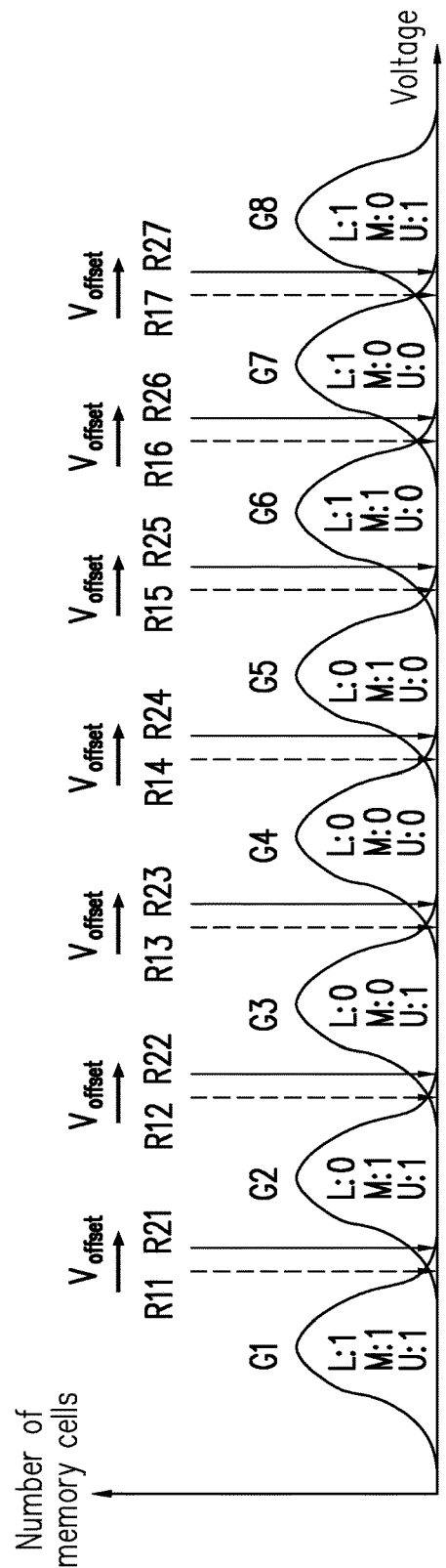
FIG. 4 is a graph illustrating two different read voltage sets and voltage differences in between the two sets according to an embodiment of the invention.

FIG. 4 is a graph illustrating two different read voltage sets and voltage differences in between the two sets according to an embodiment of the invention.

For example, referring to FIG. 4, assuming that the first read voltage set VR(1) is the first read voltage set (e.g., the default read voltage set) of the X read voltage sets, and the second read voltage set VR(2) is the second read voltage set of the X read voltage sets, a voltage difference between the pair of adjacent read voltage sets is a predetermined voltage difference ($V_{offset}$). For example, a voltage difference between the first read voltage R21 of the second read voltage set and the corresponding first read voltage R11 of the first read voltage set is the predetermined voltage difference ($V_{offset}$). In other words, a difference obtained by subtracting the voltage value of the read voltage R11 from the voltage value of the read voltage R21 is $V_{offset}$.

It should be noted that, in the X read voltage sets, a plurality of read voltage sets may be formed by using the first read voltage set as the basis and gradually increasing or decreasing the predetermined voltage difference. For the ease of description, the following embodiment is described with an example where the X read voltage sets are formed by using the first read voltage set as the basis and gradually increasing the predetermined voltage difference. Nevertheless, such example shall not be construed as a limitation on the X read voltage sets of the invention.

It should be noted that, in response to choosing the target word line, the read voltage management circuit unit 215 may identify a plurality of statistical values of the target word line, and adjust the size of the predetermined voltage difference and the value of the second predetermined positive integer based on at least one of the statistical values. The statistical values include the value of program erase cycles of the target word line, the read counter value of the target word line, the retention time value of the target word line, and the number of error bits of the data stored in the target word line. Specifically, if one of the statistical values indicates that the physical condition of the target word line is less desirable (e.g., having a higher number of error bits or a higher value of program erase cycles), the read voltage management circuit unit 215 may obtain a smaller predetermined voltage difference and a greater second predetermined positive integer to look for the optimized read voltage set in a more fine-grained manner by using a greater number of read voltage sets whose intervals in between the two sets are smaller. Comparatively, if one of the statistical values indicates that the physical condition of the target word line is more desirable (e.g., having a lower number of error bits or a lower value of program erase cycles), the read voltage management circuit unit 215 may obtain a greater predetermined voltage difference and a smaller second predetermined positive integer to look for the optimized read voltage set in a more coarse-grained manner by using a smaller number of read voltage sets whose intervals in between the two sets are greater.

In the embodiment, in the operation of respectively reading the target memory cells by using the different X read voltage sets to obtain the corresponding X Gray code summation sets, the read voltage circuit unit 215 (e.g., the Gray code counter circuit 2151) may choose the $i^{th}$ read voltage set in the X read voltage sets, wherein the values of i may include 1 to X based on the first predetermined order. For example, referring to FIG. 3, it is assumed that i is 1. In other words, the read voltage management circuit unit 215 chooses the first read voltage set (i.e., the first read voltage set VR(1)) in the X read voltage sets to read the target memory cells of the target word line.

Then, the read voltage management circuit unit 215 (e.g., the Gray code counter circuit 2151) respectively reads the target memory cells by using the N−1 read voltages of the $i^{th}$ read voltage set to obtain the read bit values classified into the Gray codes and corresponding to the $i^{th}$ read voltage set. Based on the above, the read voltage management circuit unit 215 uses the seven read voltages R11 to R17 of the first read voltage set VR(1) to read the target memory cells of the target word line to identify the Gray codes corresponding to the respective target memory cells and classify the target memory cells based on the different Gray codes. For example, the target memory cell identified as having the read bit value "111" may be classified into the Gray code "111".

Then, based on the obtained read bit values corresponding to the $i^{th}$ read voltage set and the Gray codes corresponding to the read bit values, the read voltage management circuit unit 215 may sum up the numbers of the read bit values classified into the respective Gray codes as N Gray code counts corresponding to the $i^{th}$ read voltage set. The Gray code counts are arranged based on a third predetermined order (e.g., from left to right and from the first to the eighth). For example, after the read bit values of the target memory cells are identified, the target memory cells are classified into a plurality of different Gray codes G1 to G8 based on the read bit values, and the numbers of the target memory cells corresponding to the respectively different Gray codes may be summed up. As an example, the number of the target memory cells whose read bit value corresponds to the Gray code G1 "111" may be summed up as a Gray code count $C^{1,1}$. Accordingly, Gray code counts $C_{1,1}$ to $C_{1,8}$ respectively corresponding to the Gray codes G to G8 may be calculated. The left digit in the subscripted "1,1" in "$C_{1,1}$" represents the order value of the read voltage set corresponding to the Gray code count in the X read voltage sets based on the first predetermined order, and the right digit represents the order value of the Gray code count in the Gray code count set to which the Gray code count belongs based on the third predetermined order.

It should be noted that the read voltage management circuit unit 215 (e.g., the Gray code counter circuit 2151) may obtain the first read voltage set and a corresponding threshold voltage distribution diagram to calculate the Gray code counts $C_{1,1}$ to $C_{1,8}$ which correspond to the first read voltage set and respectively correspond to the Gray codes G1 to G8. For example, the Gray code count $C_{1,1}$ corresponding to the Gray code G1 may be considered as the number of memory cells of the threshold voltage distribution on the left of the read voltage R11 (e.g., the grey area corresponding to the Gray code G1 shown in FIG. 3). The Gray code count $C_{1,5}$ corresponding to the Gray code G5 may be considered as the number of memory cells of the threshold voltage distribution between the read voltage R14 and the read voltage R15 (e.g., the grey area corresponding to the Gray code G5 shown in FIG. 3). The Gray code count $C_{1,8}$ corresponding to the Gray code G8 may be considered as the number of memory cells of the threshold voltage distribution on the right of the read voltage R17 (e.g., the grey area corresponding to the Gray code G8 shown in FIG. 3).

Figure 5:
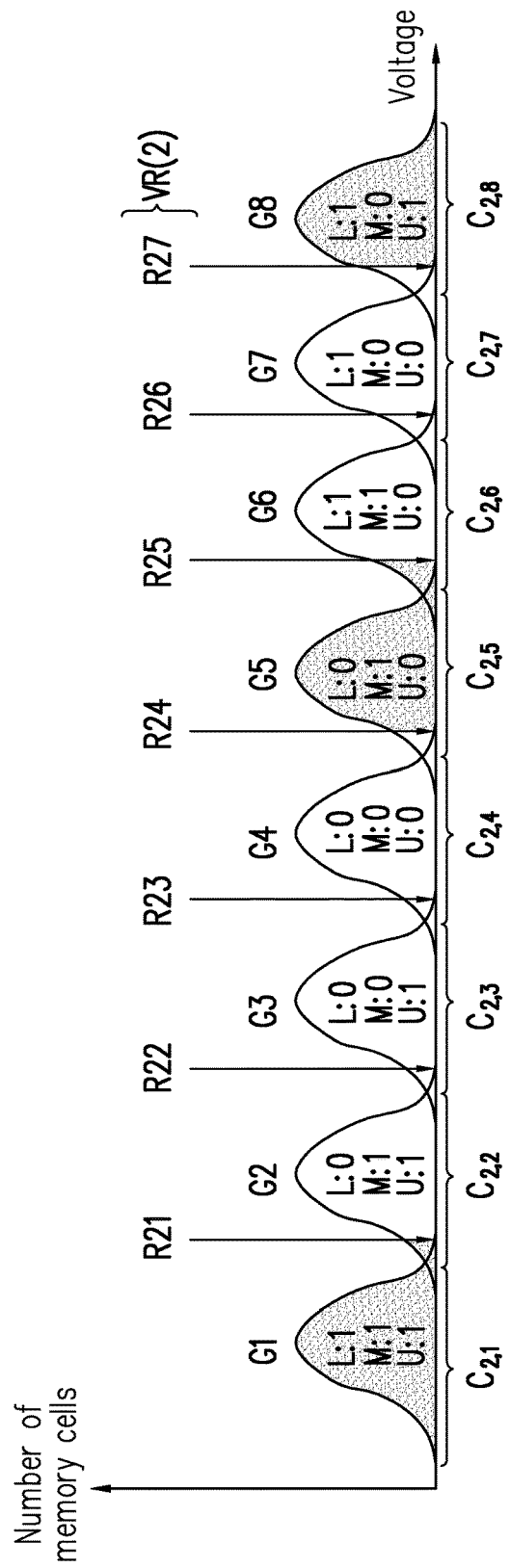
FIG. 5 is a graph illustrating a threshold voltage distribution of a plurality memory cells corresponding to bit values of N Gray codes and read by the second read voltage set and a plurality of corresponding Gray code counts according to an embodiment of the invention.

FIG. 5 is a graph illustrating a threshold voltage distribution of a plurality memory cells corresponding to bit values of N Gray codes and read by the second read voltage set and a plurality of corresponding Gray code counts according to an embodiment of the invention. Referring to FIG. 5, based on the same principle, if i=2, the read voltage management circuit unit 215 may obtain the second read voltage set VR(2) and a corresponding threshold voltage distribution diagram to calculate Gray code counts $C_{2,1}$ to $C_{2,8}$ which correspond to the second read voltage set and respectively correspond to the Gray codes G1 to G8. For example, the Gray code count $C_{2,1}$ corresponding to the Gray code G1 may be considered as the number of memory cells of the threshold voltage distribution on the left of the read voltage R21 (e.g., the grey area corresponding to the Gray code G shown in FIG. 5). The Gray code count $C_{2,5}$ corresponding to the Gray code G5 may be considered as the number of memory cells of the threshold voltage distribution between a read voltage R24 and a read voltage R25 (e.g., the grey area corresponding to the Gray code G5 shown in FIG. 5). The Gray code count $C_{2,8}$ corresponding to the Gray code G8 may be considered as the number of memory cells of the threshold voltage distribution on the right of a read voltage R27 (e.g., the grey area corresponding to the Gray code G8 shown in FIG. 5).

It should be noted that, compared with the respective read voltages R11 to R17 of the corresponding first read voltage set VR(1), the respective read voltages R21 to R27 of the second read voltage set VR(2) are respectively moved rightward by a $V_{offset}$. Therefore, the obtained Gray code counts $C_{2,1}$ to $C_{2,8}$ corresponding to the second read voltage set VR(2) may differ from the obtained Gray code counts $C_{1,1}$ to $C_{1,8}$ corresponding to the first read voltage set VR(1) (the areas of the threshold voltage distributions corresponding to the Gray codes are different).

It should be noted that, in the embodiment, the X read voltage sets are determined based on a read voltage quick read voltage screening operation. Details in this respect are described in the following with reference to FIG. 10.

Figure 10:
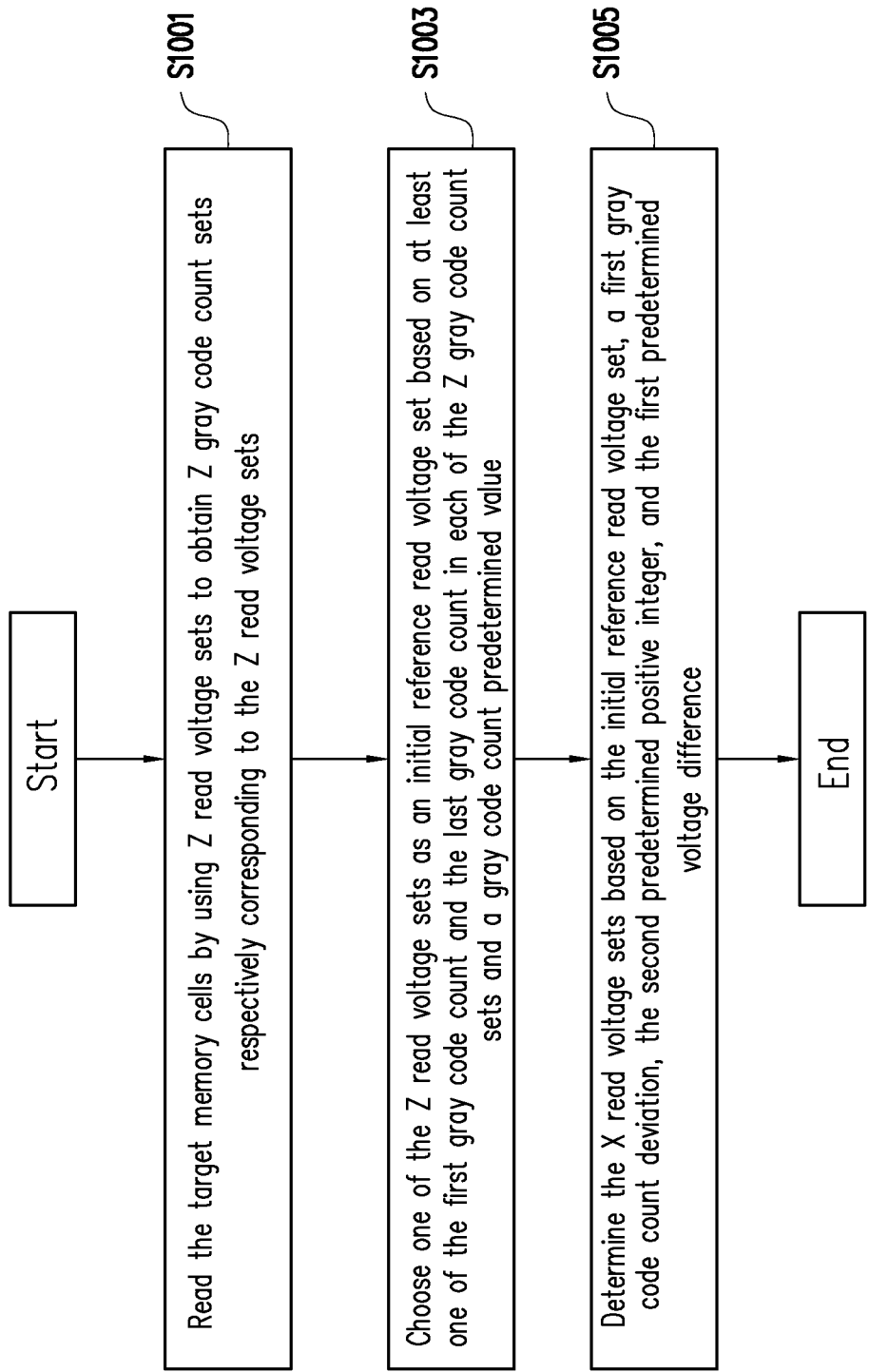
FIG. 10 is a flowchart illustrating a quick read voltage screening operation according to an embodiment of the invention.

FIG. 10 is a flowchart illustrating a quick read voltage screening operation according to an embodiment of the invention. Referring to FIG. 10, at the beginning of the quick read voltage screening operation, i.e., Step S1001, the read voltage management circuit unit 215 (i.e., the Gray code counter circuit 2151) may read the target memory cells by using Z read voltage sets to obtain Z Gray code count sets corresponding to the Z read voltage sets. In addition, a voltage difference between every pair of adjacent read voltage sets in the Z read voltage sets is the second predetermined voltage difference. The values of Z and the second predetermined voltage difference may be set in advance in the factory setting. The second predetermined voltage difference is greater than the first predetermined voltage difference. The voltage range covered by the whole Z read voltage sets may be greater than the voltage range covered by the whole X read voltage sets. Details about obtaining the Gray code count sets are already described in the foregoing, and the process is similar to the process of obtaining the Gray code count sets by using the X read voltage sets. Thus, no further details in this regard will be reiterated in the following.

Then, at Step S1003, the read voltage management circuit unit 215 (e.g., the Gray code counter circuit 2151) may choose one of the Z read voltage sets as an initial reference read voltage set based on at least one of the first Gray code count and the last Gray code count in each of the Z Gray code count sets and a Gray code count predetermined value. The Gray code count predetermined value may be set based on the total number of the target memory cells that are read (also referred to as an amount of read memory cells). As an example, the total number of the read target memory cells is 18592*8. In this example, the read target memory cells include a plurality of memory cells storing 16 kilobytes of user data and a plurality of memory cells storing 2208 bytes of system data. "18592" in "18592*8" may also be referred to as a Gray code count predetermined value (may be represented as $C_{preset}$) or a Gray code count average value (may be referred to as $C_{average}$). In addition, the Gray code count predetermined value is the amount of read memory cells divided by 8. It should be noted that, the choice is based on at least one of the first Gray code count and the last Gray code count of each of the Gray code count sets because Gray code counts other than the first and last Gray code counts in each of the Gray code count sets are unable to reflect the phenomenon that the read voltage set used is excessively deviated from the current threshold voltage distributions of the target memory cells when the read voltage sets having different voltage ranges are used. In other words, the Gray code counts other than the first and last Gray code counts in each of the Gray code count sets are not discriminable and thus not applicable in the quick read voltage screening operation.

More specifically, assuming that the quick read voltage screening operation obtains the last Gray code count (e.g., $C_{q,8}$, wherein q is 1 to Z) of each of the Gray code count sets and the Gray code count predetermined value to choose one of the Z read voltage sets as the initial reference read voltage set in the embodiment, the read voltage management circuit unit 215 (e.g., the Gray code counter circuit 2151) may compare an absolute value (also referred to as the second Gray code count deviation, i.e., $|C_{q,8}-C_{preset}|$) of a difference (also referred to as the first Gray code count deviation, i.e., $C_{q,8}-C_{preset}$) obtained by subtracting the Gray code count predetermined value from the last Gray code count of each of the Gray code count sets, and may identify the minimum among the second Gray code count deviations corresponding to all the Gray code count sets (i.e., identifying the minimum among all the obtained second Gray code count deviations). Assuming that a $Q_{th}$ Gray code count set in the Z Gray code count sets has the minimum Gray code count deviation obtained by subtracting the Gray code count predetermined value from the last Gray code count, the read voltage management circuit unit 215 (e.g., the Gray code counter circuit 2151) may obtain the $Q_{th}$ read voltage set in the Z read voltage sets as the initial reference read voltage set. In another embodiment, assuming that the quick read voltage screening operation obtains the first Gray code count (e.g., $C_{q,1}$, wherein q is 1 to Z) of each of the Gray code count sets and the Gray code count predetermined value to choose one of the Z read voltage sets as the initial reference read voltage set, the read voltage management circuit unit 215 (e.g., the Gray code counter circuit 2151) may compare the absolute value (also referred to as the second Gray code count deviation, i.e., $|C_{q,1}-C_{preset}|$) of a difference (also referred to as the first Gray code count deviation, i.e., $C_{q,1}-C_{preset}$) obtained by subtracting the Gray code count predetermined value from the first Gray code count of each of the Gray code count sets, and may identify the minimum among the second Gray code count deviations corresponding to all the Gray code count sets (i.e., identifying the minimum among all the obtained second Gray code count deviations), so as to obtain the read voltage set corresponding to the minimum second Gray code count deviation as the initial reference read voltage set. In yet another embodiment, assuming that the quick read voltage screening operation obtains the first Gray code count and the last Gray code count of each of the Gray code count sets and the Gray code count predetermined value to choose one of the Z read voltage sets as the initial reference read voltage set, the read voltage management circuit unit 215 (e.g., the Gray code counter circuit 2151) may obtain a value obtained by adding the absolute value of the difference obtained by subtracting the Gray code count predetermined value from the first Gray code count of each of the Gray code count sets to the absolute value of the difference obtained by subtracting the Gray code count predetermined value from the last Gray code count of each of the Gray code count sets as a third Gray code count deviation (i.e., $|C_{q,1}-C_{preset}|+|C_{q,8}-C_{preset}|$) of each of the Gray code count sets, and identify the minimum (i.e., identifying the minimum of the obtained third Gray code count deviations) to obtain the read voltage set corresponding to the minimum third Gray code count deviation as the initial reference read voltage set.

Then, after the initial reference read voltage set is determined, at Step S1105, the read voltage management circuit unit 215 (e.g., the Gray code counter circuit 2151) may determine the X read voltage sets based on the initial reference read voltage set, the first Gray code count deviation, the second predetermined positive integer, and the first predetermined voltage difference. Specifically, the initial reference read voltage set may be included in the X read voltage sets, and the voltage range of the X read voltage sets does not exceed the voltage range of the Z read voltage sets. Specifically, the second predetermined positive integer determines the total number of the X read voltage sets, the first predetermined voltage difference determines the voltage difference between every pair of adjacent read voltage sets, and the first Gray code count deviation serves to determine a position (sequence position) of the initial reference read voltage set in the voltage range of the X read voltage sets. In other words, the voltage range of the X read voltage sets is determined by making a leftward or rightward adjustment on the basis of the initial reference read voltage set. The leftward/rightward adjustment here refers to shifting the whole voltage range toward the left or right using the initial reference read voltage set as the center without modifying the breadth of the voltage range. For example, if the whole voltage range is shifted leftward using the initial reference read voltage set as the center, the first to last read voltage sets in the voltage range of the X read voltage sets may be lower than the first to last read voltage sets in the voltage range of the X read voltage sets before the adjustment.

For example, assuming that in the quick read voltage screening operation, one of the Z read voltage sets is chosen as the initial reference read voltage set based on the last Gray code count of each of the Gray code count sets (i.e., the Gray code count corresponding to the rightmost read voltage in each of the Gray code count sets, such as $C_{q,8}$, wherein q is 1 to Z) and the Gray code count predetermined value, the read voltage management circuit unit 215 (e.g., the Gray code counter circuit 2151) may obtain the value (i.e., $C_{q,8}$) of the first Gray code count deviation corresponding to the initial reference reading voltage set. Specifically, if the first Gray code deviation is positive, the voltage range of the X read voltage sets is obtained by adjusting the voltage range toward the right based on the initial reference read voltage set. In other words, the initial reference read voltage set may be arranged at a middle-top position among the X read voltage sets, assuming that the X read voltage sets are arranged from lower to higher. If the first Gray code deviation is negative, the voltage ranges of the X read voltage sets are obtained by adjusting the voltage range toward the left based on the initial reference read voltage set. In other words, the initial reference read voltage set may be arranged at a middle-bottom position among the X read voltage sets, assuming that the X read voltage sets are arranged from lower to higher. Similarly, when the value of the first Gray code deviation is calculated based on the first Gray code (i.e., the Gray code corresponding to the leftmost read voltage), the read voltage management circuit unit 215 (e.g., the Gray code counter circuit 2151) may obtain the value corresponding to $C_{Q,1}$ of the initial reference read voltage set. When the first Gray code count deviation is positive, the voltage range of the X read voltage sets may undergo a leftward adjustment from the initial reference read voltage set as the basis. When the first Gray code count deviation is negative, the voltage range of the X read voltage sets may undergo a rightward adjustment from the initial reference read voltage set as the basis. The extent of the adjustment may be determined proportionally to the size of the positive or negative value. When the X read voltage sets are determined, the quick read voltage screening operation is completed. It should be noted that the quick read voltage screening operation (i.e., Steps S101 to S105) is performed after Step S21 and before Step S23. However, in another embodiment, the quick read voltage screening operation may be omitted and the X read voltage sets may be directly determined.

It should be noted that the whole voltage range of the Z read voltage sets may include the whole adjustable voltage range of the read voltage during the read operation reading the memory cells. For example, the voltage range may cover a voltage range of 6V from 0V of the first read voltage of the first read voltage set to 6V of the last read voltage of the last read voltage set of the Z read voltage sets. Due to the breadth of the range, the quick read voltage screening operation may be performed to determine the X read voltage sets having a smaller voltage range, so that a subsequent read voltage optimization operation may be performed more efficiently based on the X read voltage sets having a smaller range. For example, the first read voltage of the first read voltage set to the last read voltage of the last read voltage set in the X read voltage set may cover a voltage range of 2V, and the initial reference read voltage set may be included in the voltage range. Besides, in an embodiment, the initial reference voltage set obtained by performing the quick read voltage screening operation may be directly adapted as the temporary optimized read voltage set under a special condition (e.g., the time available for the storage device to perform the read voltage optimization operation is very short). It should be noted that Z may be 256, for example, and the second predetermined voltage difference may be 7.5 mV, for example, X may be 20, for example, and the first predetermined voltage difference may be 7.5 mV or lower, for example. The voltage difference between the last read voltage and the first read voltage of each voltage set may be 4 V (volts), for example.

In the following, how the Gray code count summations/ the Gray code summation sets are obtained by using the Gray code counts are described in the following. Specifically, after obtaining the N Gray code counts of the $i^{th}$ read voltage set, the read voltage management circuit unit 215 (e.g., the Gray code counter circuit 2151) may calculate the N−1 Gray code count summations based on the N Gray code counts corresponding to the $i^{th}$ read voltage set and the second predetermined order, and obtain the N−1 Gray code count summations as the $i^{th}$ Gray code summation set corresponding to the $i^{th}$ read voltage set in the X Gray code summation sets, wherein the value of the $j^{th}$ Gray code count summation in the N−1 Gray code count summations is a summation of the first j Gray codes.

Figure 6A:
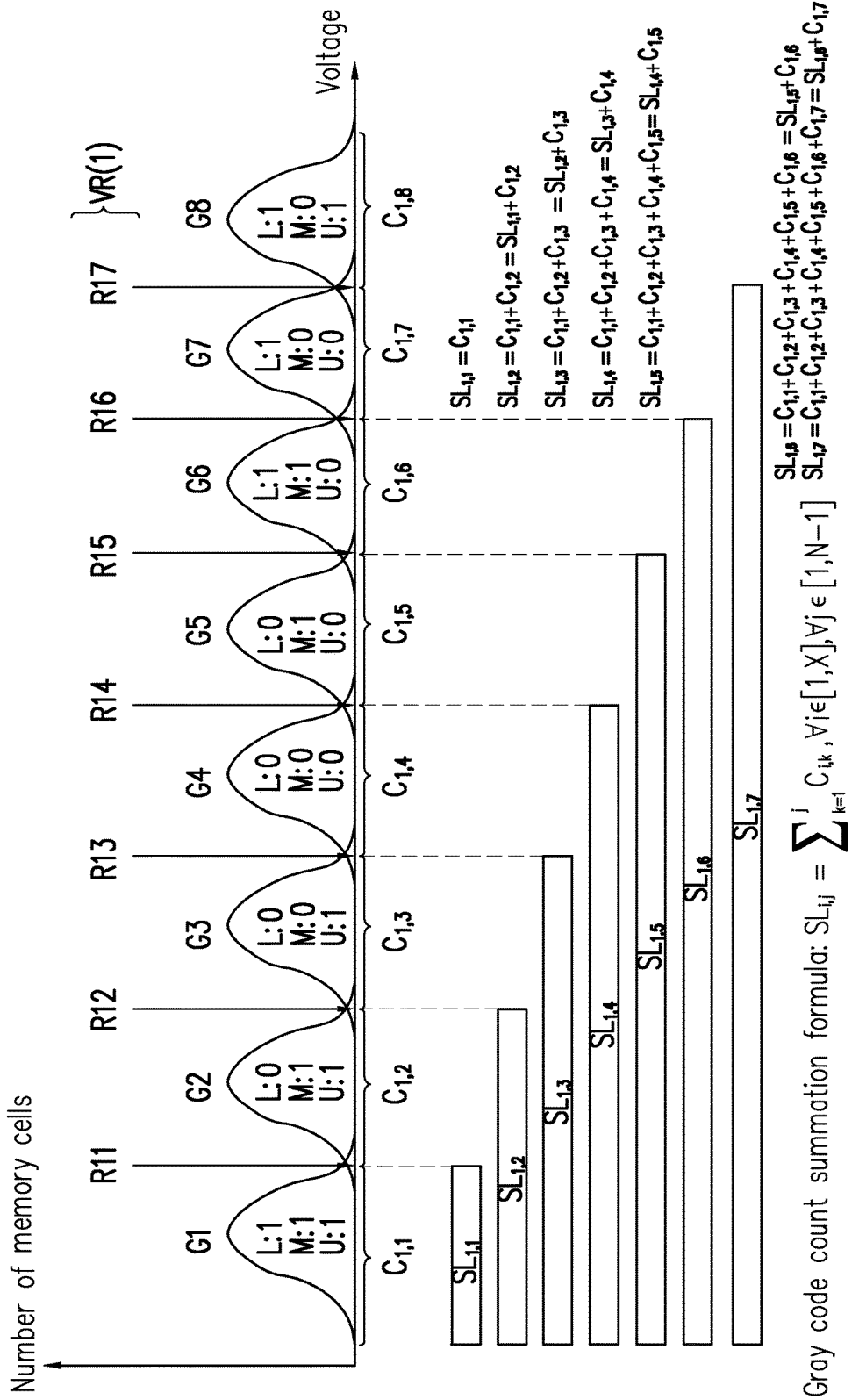
FIG. 6A is a graph illustrating calculations to Gray code count summations corresponding to the first read voltage set based on the second predetermined order (i.e., from left to right) according to an embodiment of the invention.

FIG. 6A is a graph illustrating calculations to a Gray code count summation corresponding to the first read voltage set based on the second predetermined order (i.e., from left to right) according to an embodiment of the invention. Referring to FIG. 6A, assuming that i is 1 and N is 8, for example, after obtaining the eight Gray codes $C_{1,1}$ to $C_{1,8}$ of the first read voltage set, the read voltage management circuit unit 215 (e.g., the Gray code counter circuit 2151) may refer to the Gray codes $C^{1,1}$ to $C_{1,8}$ of the first read voltage set VR(1) and the second predetermined order. Regarding the first (i.e., j=1) Gray code count summation $SL_{1,1}$ corresponding to the first read voltage set VR(1), the read voltage management circuit unit 215 may sum up a summation of the first Gray code count. In other words, the read voltage management circuit unit 215 only sums up the first Gray code count $C_{1,1}$ (i.e., $SL_{1,1}=C_{1,1}$). Regarding the second (i.e., j=2) Gray code count summation $SL_{1,2}$ corresponding to the first read voltage set VR(1), the read voltage management circuit unit 215 may sum up a summation of the first two Gray code counts. In other words, the read voltage management circuit unit 215 only sums up the first Gray code count $C_{1,1}$ and the second Gray code count $C_{1,2}$ (i.e., $SL_{1,2}=C_{1,1}+C_{1,2}=SL_{1,1}+C_{1,2}$). Following the principle, the read voltage management circuit unit 215 (e.g., the Gray code counter circuit 2151) may calculate the Gray code count summations $SL_{1,1}$ to $SL_{1,7}$, and obtain the seven Gray code count summations $SL_{1,1}$ to $SL^{1,7}$ as a Gray code summation set SL(1) corresponding to the first read voltage set VR(1).

In the embodiment, the read voltage management circuit unit 215 (e.g., the Gray code counter circuit 2151) may use a Formula (F1) as follows to calculate the N−1 Gray code count summations of each of the X Gray code summation sets:

$$SL_{i,j}=\Sigma_{k=1}^{j}C_{i,k}, \forall i \in [1,X], \forall j \in [1,N-1] \tag{F1}$$

$SL_{i,j}$ represents the $j^{th}$ Gray code count summation in the $i^{th}$ Gray code summation set corresponding to the $i^{th}$ read voltage set, $C_{i,k}$ represents the $k^{th}$ Gray code count in the N Gray code counts corresponding to the $i^{th}$ read voltage set, wherein values of k include 1 to N−1 based on the second predetermined order. The left digit in the subscripted "1,1" of "$SL_{1,1}$" represents the order value of the read voltage set corresponding to the Gray code count summation in the X read voltage sets based on the first predetermined order (e.g., "1" represents the first read voltage set that is arranged first in the X read voltage sets), and the right digit represents the order value of the Gray code count summation in the Gray code summation set to which the Gray code count summation belongs based on the second predetermined order (e.g., "1" represents the Gray code count summation that is arranged first in the Gray code summation set). Besides, "L" in "$SL_{1,1}$" represents that the Gray code count summation is calculated by summing up the Gray code counts toward the right from the "left". It should be noted that when the value of the $j^{th}$ Gray code count summation is calculated according to another embodiment, the summation of the first j Gray code counts may not be calculated by summing up from left to right.

It should be noted that the invention shall not be limited to the method of calculating the Gray code count summation in the order from left to right. For example, in another embodiment, the read voltage management circuit unit 215 (e.g., the Gray code counter circuit 2151) may calculate the Gray code count summation in an order from right to left. Specifically, the read voltage management circuit unit 215 (e.g., the Gray code counter circuit 2151) may calculate the N−1 Gray code count summations based on the N Gray code counts corresponding to the $i^{th}$ read voltage set and a fourth predetermined order, and obtain the N−1 Gray code count summations as the $i^{th}$ Gray code summation set corresponding to the $i^{th}$ read voltage set in the X Gray code summation sets, wherein the value of the $j^{th}$ Gray code count summation in the N−1 Gray code count summations is a summation of the "last N−j" Gray code counts, and the fourth predetermined order is reverse of the second predetermined order. Details in this respect will be described with reference to FIG. 6B.

Figure 6B:
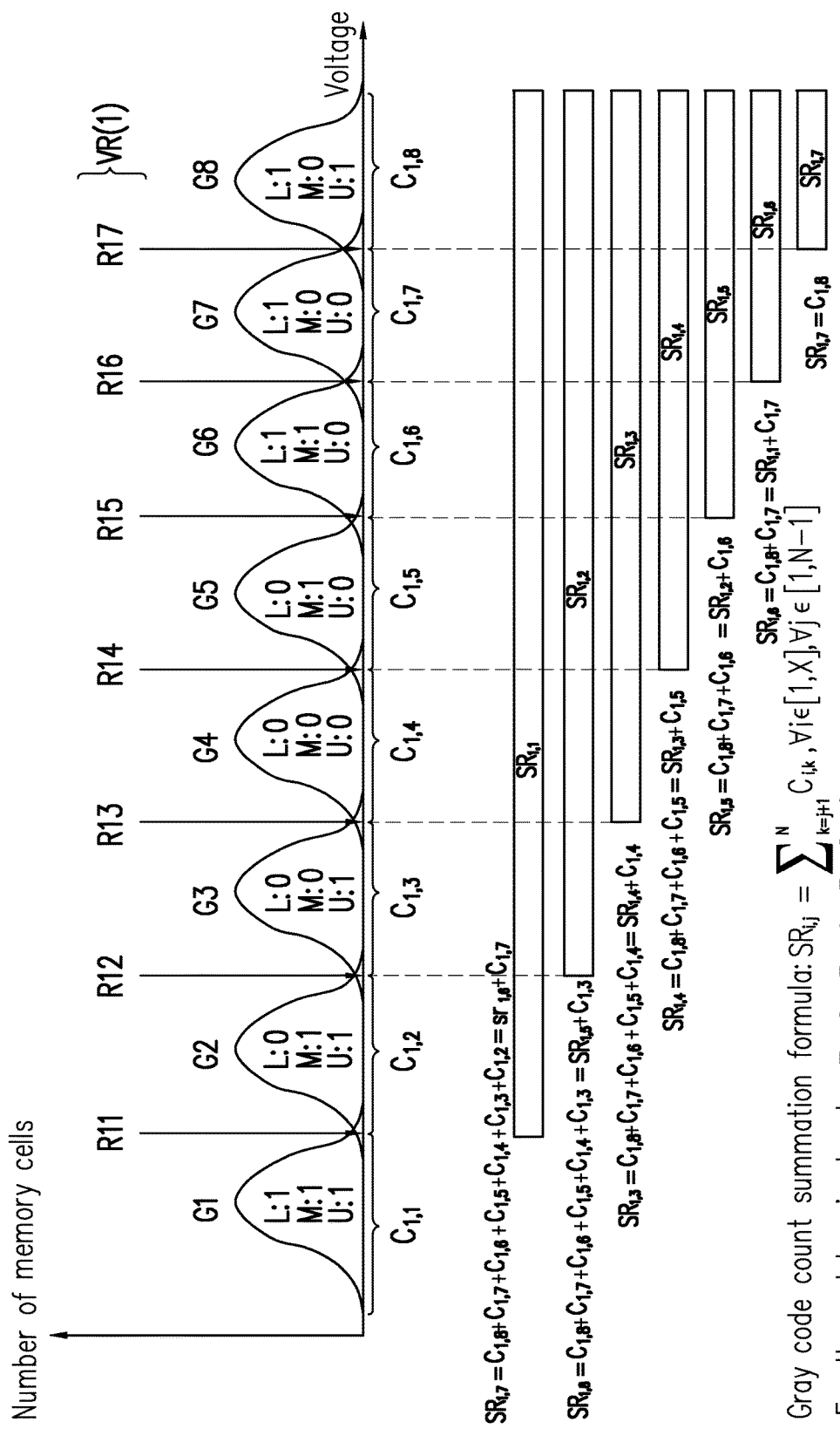
FIG. 6B is a graph illustrating calculations to Gray code count summations corresponding to the first read voltage set based on a fourth predetermined order (i.e., from right to left) according to an embodiment of the invention.

FIG. 6B is a graph illustrating calculations to a Gray code count summation corresponding to the first read voltage set based on a fourth predetermined order (i.e., from right to left) according to an embodiment of the invention. Referring to FIG. 6B, in this embodiment, it is assumed that i is 1 and N is 8. For example, after obtaining the eight Gray code counts $C_{1,1}$ to $C_{1,8}$ corresponding to the first read voltage set, the read voltage management circuit unit 215 (e.g., the Gray code counter circuit 2151) may refer to the $C_{1,1}$ to $C_{1,8}$ Gray code counts of the first read voltage set VR(1) and the fourth predetermined order (reverse of the second predetermined order). Regarding the first (i.e., j=1) Gray code count summation $SR_{1,1}$ corresponding to the first read voltage set VR(1), the read voltage management circuit unit 215 may refer to the fourth predetermined order and render a summation of the last seven (i.e., N−j=7) Gray code counts from right to left based on the fourth predetermined order. In other words, the counts are added up in a reverse (leftward) manner from the rightmost (last) eighth Gray code count C1,8 to the second Gray code count C1,2, i.e., $SR_{1,1} = C_{1,8} + C_{1,7} + C_{1,6} + C_{1,5} + C_{1,4} + C_{1,3} + C_{1,2} = SR_{1,6} + C_{1,2}$. Regarding the seventh (i.e., j=7) Gray code count summation $SR_{1,7}$ corresponding to the first read voltage set VR(1), the read voltage management circuit unit 215 may render a summation of the last Gray code count. In other words, the read voltage management circuit unit 215 only sums up the eighth Gray code count $C_{1,8}$ (i.e., $SR_{1,7} = C_{1,8}$). Following the principle, the read voltage management circuit unit 215 (e.g., the Gray code counter circuit 2151) may calculate the Gray code count summations $SR_{1,1}$ to $SR_{1,7}$, and obtain the seven Gray code count summations $SR_{1,1}$, to $SR^{1,7}$ as a Gray code summation set SR(1) corresponding to the first read voltage VR(1).

In the embodiment, the read voltage management circuit unit 215 (e.g., the Gray code counter circuit 2151) may use a Formula (F2) as follows to calculate the N−1 Gray code count summations of each X Gray code summation sets:

$$SR_{i,j} = \Sigma_{k=j+1}^{N} C_{i,k}, \forall i \in [1,X], \forall j \in [1,N-1] \tag{F2}$$

$SR_{i,j}$ represents the $j^{th}$ Gray code count summation in the $i^{th}$ Gray code summation set corresponding to the $i^{th}$ read voltage set, $C_{i,k}$ represents the $k^{th}$ Gray code count in the N Gray code counts corresponding to the $i^{th}$ read voltage set, wherein the values of k include N to j+1 based on the fourth predetermined order. The left digit in the subscripted "1,1" of "$SR_{1,1}$" represents the order value of the corresponding read voltage set corresponding to the Gray code count summation in the X read voltage sets based on the first predetermined order (e.g., "1" represents the first read voltage set that is arranged first in the X read voltage sets), and the right digit represents the order value of the Gray code count summation in the Gray code summation set to which the Gray code count summation belongs based on the second predetermined order (e.g., "1" represents the Gray code count summation that is arranged first in the Gray code summation set). Besides, "R" in "$SR_{1,1}$" represents that the Gray code count summation is calculated by summing the Gray code counts toward the left from the "right". It should be noted that when the value of the $j^{th}$ Gray code count summation is calculated according to another embodiment, the summation of the N−j Gray code counts may not be calculated by summing up from right to left.

Figure 7:
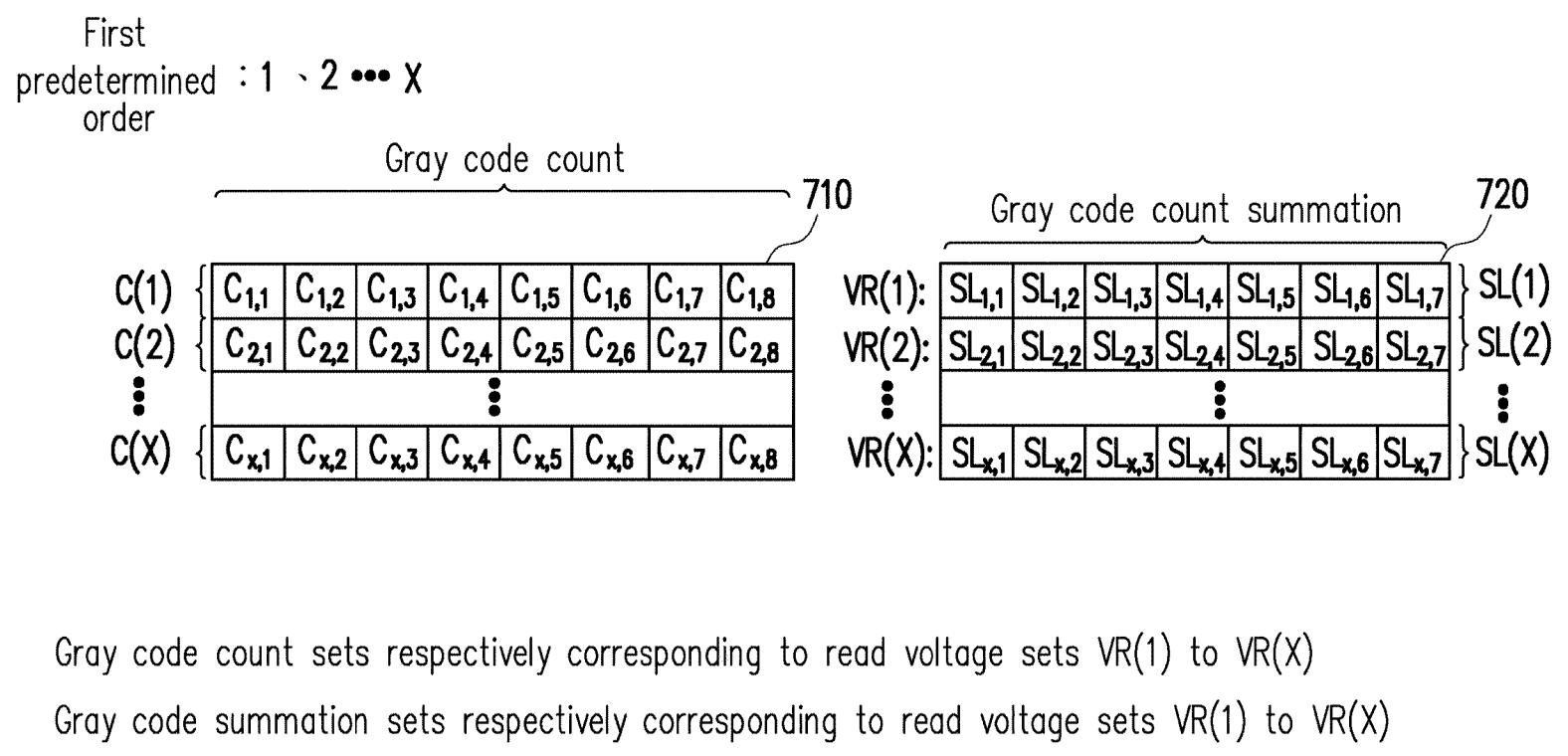

FIG. 7 is a schematic diagram illustrating a statistics table recording Gray code counts, corresponding Gray code count summations, and Gray code summation sets (second predetermined order) according to an embodiment of the invention.

Referring to FIG. 7, the read voltage management circuit unit 215 may record Gray code count sets C(1) to C(X) and Gray code summation sets SL(1) to SL(X) obtained in correspondence with the X read voltage sets in the form of statistics tables 710 and 720 shown in FIG. 7. For the ease of description, the following main describes a read voltage optimization operation based on the Gray code summation sets obtained based on the second predetermined order.

Referring to FIG. 2, at Step S25, the read voltage management circuit unit 215 follows the first predetermined order and chooses every pair of adjacent Gray code summation sets of the X Gray code summation sets, and calculates the Gray code count summation difference of the Gray code count summations at the same sequence position in the respective N−1 Gray code count summations between every pair of Gray code summation sets that are chosen based on the second predetermined order to obtain X−1 Gray code count summation difference sets corresponding to all the pairs of the Gray code summation sets.

In addition, in the operation of choosing the every pair of adjacent Gray code summation sets in the X gray code summation sets based on the first predetermined order and calculating the Gray code count summation difference of the Gray code count summations at the same sequence position in the respective N−1 Gray code count summations between every pair of Gray code summation sets that are chosen based on the second predetermined order to obtain the X−1 Gray code count summation difference sets corresponding to all the pairs of the Gray code summation sets, the read voltage management circuit unit 215 (e.g., the read voltage optimization circuit 2152) may choose the $i^{th}$ Gray code summation set and the $i+1^{th}$ Gray code summation set from the X Gray code summation sets (by using the recorded statistics table 720, for example). The read voltage management circuit unit 215 (e.g., the read voltage optimization circuit 2152) may follow the second predetermined order and calculate a difference between the $j^{th}$ Gray code count summation in the N−1 Gray code count summations of the $i+1^{th}$ Gray code summation set and the $j^{th}$ Gray code count summation in the N−1 Gray code count summations of the $i^{th}$ Gray code summation set, and obtain the difference as the $j^{th}$ Gray code count summation difference in N−1 Gray code count summation differences of the $i^{th}$ Gray code count summation difference set in X−1 Gray code count summation difference sets. In addition, the $i^{th}$ Gray code count summation difference set corresponds to the $i^{th}$ read voltage set and the i+1 read voltage set, and the $j^{th}$ Gray code count summation difference in the $i^{th}$ Gray code count summation difference set corresponds to the $j^{th}$ read voltage in the $i^{th}$ read voltage set and the $j^{th}$ read voltage in the $i+1^{th}$ read voltage set. Details in this respect will be described with reference to an example shown in FIG. 8.

Figure 8A:
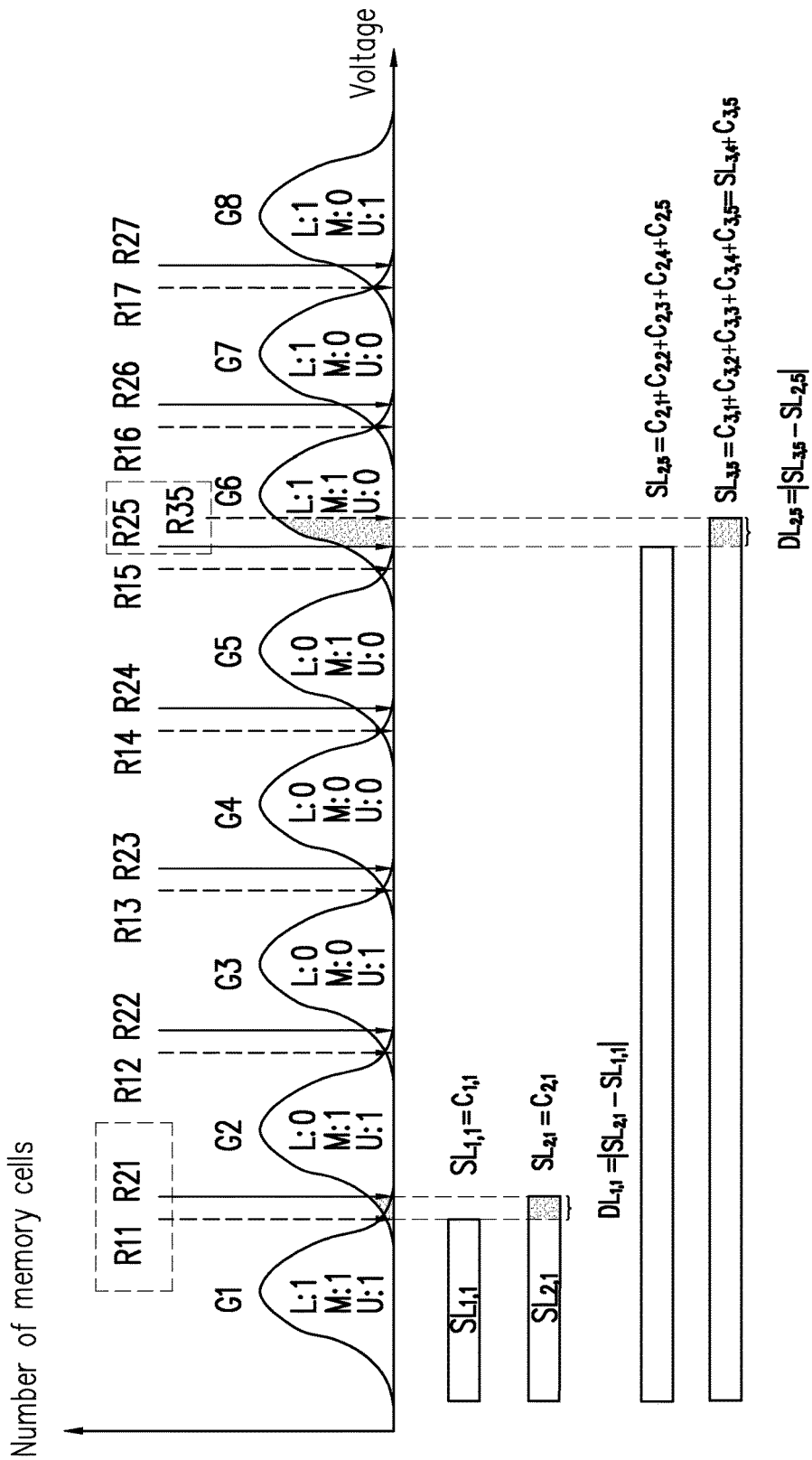
FIG. 8A is a graph illustrating calculations to a Gray code count summation difference corresponding to a pair of adjacent read voltage sets based on the second predetermined order (i.e., from left to right) according to an embodiment of the invention.

FIG. 8A is a graph illustrating calculations to a Gray code count summation difference corresponding to a pair of adjacent read voltage sets based on the second predetermined order (i.e., from left to right) according to an embodiment of the invention.

Referring to FIG. 8A, FIG. 8A is a graph illustrating calculations to the Gray code count summation differences based on the Gray code count summations $SL_{1,1}$ to $SL_{1,7}$ calculated in the example of FIG. 6A. For example, it is assumed that, regarding the pairs of adjacent read voltage sets in the X read voltage sets, the read voltage management circuit unit 215 (e.g., the read voltage optimization circuit 2152) chooses the first read voltage set VR(1) and the second read voltage set VR(2) to calculate a corresponding Gray code count summation difference set DL(1). Based on the second predetermined order, the first Gray code count summation difference $DL_{1,1}$ of the Gray code count summation difference set DL(1) is calculated as follows. Following the arranged position of the first Gray code count summation difference $DL_{1,1}$, the Gray code count summation $SL_{1,1}$ arranged first in the Gray code summation set SL(1) corresponding to the first read voltage set VR(1) is identified, and the Gray code count summation $SL_{2,1}$ arranged first in the Gray code summation set SL(2) corresponding to the second read voltage set VR(2) is identified. Then, the read voltage management circuit unit 215 (e.g., the read voltage optimization circuit 2152) may calculate a difference between the Gray code count summation $SL_{1,1}$ and the Gray code count summation $SL_{2,1}$ having the same sequence position (e.g., $DL_{1,1}=|SL_{2,1}-SL_{1,1}|$), such as an area difference between bars representing $SL_{1,1}$ and $SL_{1,2}$, as indicated by the Gray block. It should be noted that calculation of the Gray code count summation difference may also be construed as follows. The read voltage management circuit unit 215 (e.g., the read voltage optimization circuit 2152) uses the threshold voltage distribution, the read voltage R11, and the read voltage R21 to calculate the area of difference (e.g., a grey area between the read voltage R11 and the read voltage R21 in the threshold voltage distribution diagram). Based on the same principle, the read voltage management circuit unit 215 (e.g., the read voltage optimization circuit 2152) may calculate the first to seventh Gray code count summation differences $DL_{1,1}$ to $DL_{1,7}$ of the Gray code count summation difference set DL(1) corresponding to the first read voltage set VR(1) and the second read voltage set VR(2).

After calculating the Gray code count summation difference set between the first read voltage set VR(1) and the second read voltage set VR(2), the read voltage management circuit unit 215 (e.g., the read voltage optimization circuit 2152) may continue to calculate a Gray code count summation difference set DL(2) corresponding to the second read voltage set VR(2) and the third read voltage set VR(3) arranged after the second read voltage set VR(2). For example, regarding the fifth Gray code count summation difference $DL_{2,5}$ of the Gray code count summation difference set DL(2), the read voltage management circuit unit 215 (e.g., the read voltage optimization circuit 2152) may calculate a difference between the Gray code count summation $SL_{2,5}$ of the Gray code summation set SL(2) corresponding to the second read voltage set VR(2) and the Gray code count summation $SL_{3,5}$ of the Gray code summation set SL(3) corresponding to the third read voltage set VR(3) having the same ($5^{th}$) sequence position (e.g., $DL_{2,5}=|SL_{3,5}-SL_{2,5}|$, obtaining the absolute value).

Accordingly, the read voltage management circuit unit 215 (e.g., the read voltage optimization circuit 2152) may calculate X−1 Gray code count summation difference sets DL(1) to DL(X−1) corresponding to all the pairs of adjacent read voltage sets in the X read voltage sets.

In other words, the read voltage management circuit unit 215 (e.g., the read voltage optimization circuit 2152) may follow a Gray code count summation difference formula (F3) as follows to calculate the respective Gray code count summation differences based on the Gray code count summations:

$$DL_{i,j}=|SL_{i+1,j}-SL_{i,j}| \tag{F3}$$

The Gray code count summation difference set DL(i) corresponds to the read voltage set VR(i) and VR(i+1), i ranges from 1 to (X−1), and j ranges from 1 to (N−1). In another embodiment, the order between "$SL_{i+1,j}$" and "$SL_{i,j}$" may be switched, i.e., $DL_{i,j}=|SL_{i,j}-SL_{i+1,j}|$.

It should be noted that the invention shall not be limited to the method of calculating the Gray code count summation differences based on the Gray code count summations calculated in the order from left to right. For example, in another embodiment, the same formula may be applied to calculate the Gray code count summation differences based on the Gray code count summations calculated in the order from right to left. Details in this respect will be described with reference to FIG. 8B.

Figure 8B:
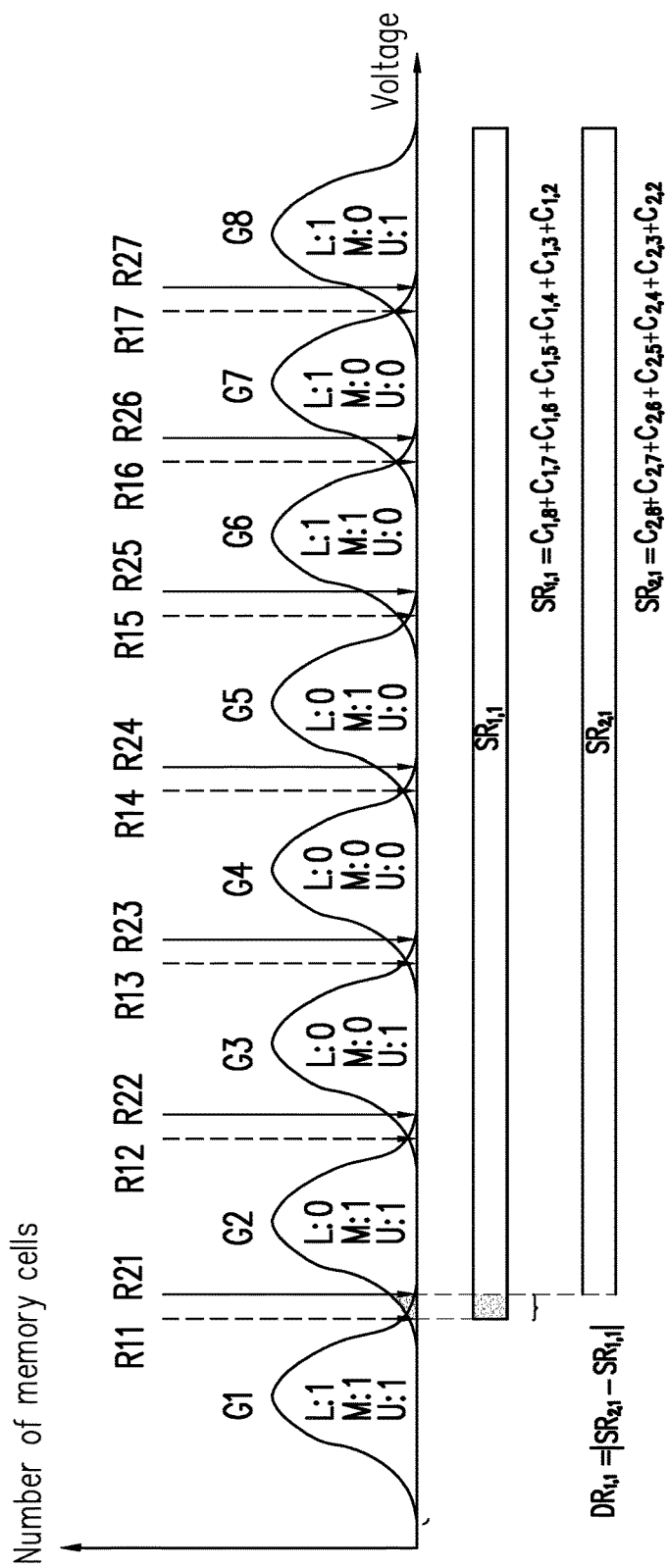
FIG. 8B is a graph illustrating calculations to a Gray code count summation difference corresponding to a pair of adjacent read voltage sets based on the fourth predetermined order (i.e., from right to left) according to an embodiment of the invention.

FIG. 8B is a graph illustrating calculations to a Gray code count summation difference corresponding to a pair of adjacent read voltage sets based on the fourth predetermined order (i.e., from right to left) according to an embodiment of the invention.

Referring to FIG. 8B, FIG. 8B is a graph illustrating calculations to the Gray code count summation differences based on the Gray code count summations $SR_{1,1}$ to $SR_{1,7}$ calculated in the example of FIG. 6B. For example, it is assumed that, regarding the pairs of adjacent read voltage sets in the X read voltage sets, the read voltage management circuit unit 215 (e.g., the read voltage optimization circuit 2152) chooses the first read voltage set VR(1) and the second read voltage set VR(2) to calculate a corresponding Gray code count summation difference set DR(1). Based on the second predetermined order, the first Gray code count summation difference $DR_{1,1}$ of the Gray code count summation difference set DR(1) is calculated as follows. Following the arranged position of the first Gray code count summation difference $DR_{1,1}$, the Gray code count summation $SR_{1,1}$ arranged first in the Gray code summation set SR(1) corresponding to the first read voltage set VR(1) is identified, and the Gray code count summation $SR_{2,1}$ arranged first in the Gray code summation set SR(2) corresponding to the second read voltage set VR(2) is identified. Then, the read voltage management circuit unit 215 (e.g., the read voltage optimization circuit 2152) may calculate a difference between the Gray code count summation $SR_{1,1}$ and the Gray code count summation $SR_{2,1}$ having the same sequence position (e.g., $DR_{1,1}=|SR_{2,1}-SR_{1,1}|$), such as an area difference between bars representing $SR_{1,1}$ and $SR_{1,2}$, as indicated by the Gray block. It should be noted that calculation of the Gray code count summation difference may also be construed as follows. The read voltage management circuit unit 215 (e.g., the read voltage optimization circuit 2152) uses the threshold voltage distribution, the read voltage R11, and the read voltage R21 to calculate the area of difference (e.g., a grey area between the read voltage R11 and the read voltage R21 in the threshold voltage distribution diagram).

FIG. 9 is a schematic diagram illustrating a statistics table recording Gray code count summation and corresponding Gray code count summation differences (second predetermined order) according to an embodiment of the invention.

Referring to FIG. 9, the read voltage management circuit unit 215 may record the obtained Gray code count summation difference sets DL(1) to DL(X−1) in the form of a statistics table 910. In addition, the Gray code count summation difference set DL(1) is obtained by calculating the respective differences between the pairs of the Gray code count summations having the same sequence positions in the Gray code summation set SL(1) and the Gray code summation set SL(2), as indicated by an arrow sign A9(1). Similarly, the read voltage management circuit unit 215 may obtain the Gray code count summation difference set DL(2) by calculating the respective differences between the pairs of the Gray code count summations having the same sequence positions in the Gray code summation set SL(2) and the Gray code summation set SL(3), as indicated by an arrow sign A9(2). The Gray code count summation difference set DL(X−1) may be obtained by calculating the respective differences between the pairs of the Gray code count summations having the same sequence positions in the Gray code summation set SL(X−1) and the Gray code summation set SL(X), as indicated by an arrow sign A9(X−1).

It should be noted that the statistics table 710, 720, and 910 merely serve as a way of recording. People having ordinary skills in the art may record relevant information without departing from the spirit of the statistics table to calculate the Gray code counts, the Gray code count summations and the Gray code count summation differences.

After calculating the X−1 Gray code count summation difference sets, at Step S27, the read voltage management circuit unit 215 may determine N−1 optimized read voltages corresponding to the second predetermined order from the X*(N−1) read voltages in the X read voltage sets based on the N−1 Gray code count summation differences in each of the X−1 Gray code count summation difference sets, so as to form an optimized read voltage set corresponding to the target word line.

More specifically, based on the second predetermined order, the read voltage management circuit unit 215 may choose the $j^{th}$ Gray code count summation difference from each of the X−1 Gray code count summation difference sets to obtain X−1 $j^{th}$ Gray code count summation differences. In addition, the read voltage management circuit unit 215 may determine the $j^{th}$ optimized read voltage in the N−1 optimized read voltages of the optimized read voltage set based on the X−1 $j^{th}$ Gray code count summation differences.

For example, assuming that j=1, the read voltage management circuit unit 215 (e.g., the read voltage optimization circuit 2152) may choose a total of X−1 first (i.e., j=1) Gray code count summation differences $DL_{1,1}$, $DL_{2,1}$ ... $DL_{X-1,1}$ of the X−1 Gray code count summation difference sets DL(1), DL(2) ... DL(X−1) from each of the X−1 Gray code count summation difference sets DL(1), DL(2) ... DL(X−1). Then, the read voltage management circuit unit 215 (e.g., the read voltage optimization circuit 2152) may determine the first optimized read voltage (i.e., the optimized read voltage arranged first in the optimized read voltage set) in the seven (N−1=8−1=7) optimized read voltages of the optimized read voltage set based on the total of X−1 first Gray code count summation differences $DL_{1,1}$, $DL_{2,1}$, ... $DL_{X-1,1}$.

More specifically, the read voltage management circuit unit 215 (e.g., the read voltage optimization circuit 2152) may identify a plurality of target $j^{th}$ Gray code count summation differences lower than an optimization threshold in the X−1 $j^{th}$ Gray code count summation differences. For example, the read voltage management circuit unit 215 (e.g., the read voltage optimization circuit 2152) may identify a plurality of first Gray code count summation differences (also referred to as target first Gray code count summation differences) lower than the optimization threshold in the total of X−1 first Gray code count summation differences $DL_{1,1}$, $DL_{2,1}$, ... $DL_{X-1,1}$.

Then, the read voltage management circuit unit 215 (e.g., the read voltage optimization circuit 2152) may perform a check operation to the target $j^{th}$ Gray code count summation differences to identify one or more incorrect $j^{th}$ Gray code count summation differences from the target $j^{th}$ Gray code count summation differences, and choose one of remaining one or more correct $j^{th}$ Gray code count summation differences of the target $j^{th}$ Gray code count summation differences as the optimized $j^{th}$ Gray code count summation difference.

Specifically, the read voltage management circuit unit 215 (e.g., the read voltage optimization circuit 2152) may identify the Gray code count summation difference set to which one of the target $j^{th}$ Gray code count summation differences belongs, and identify the respective $j^{th}$ Gray code counts of the two Gray code summation sets corresponding to the Gray code count summation difference set to which the target $j^{th}$ Gray code count summation difference belongs. Then, the read voltage management circuit unit 215 (e.g., the read voltage optimization circuit 2152) may determine whether one of the two $j^{th}$ Gray code counts exceeds a correct range. If one of the two $j^{th}$ Gray code counts exceeds the correct range, the read voltage management circuit unit 215 (e.g., the read voltage optimization circuit 2152) may determine that the target $j^{th}$ Gray code count summation difference is incorrect (also referred to as incorrect target $j^{th}$ Gray code count summation difference). In other words, it is determined that the target $j^{th}$ Gray code count summation difference exceeding the correct range is the incorrect target $j^{th}$ Gray code count summation difference. If neither of the two $j^{th}$ Gray code counts exceeds the correct range, the read voltage management circuit unit 215 (e.g., the read voltage optimization circuit 2152) may determine that the target $j^{th}$ Gray code count summation difference is correct (also referred to as correct target $j^{th}$ Gray code count summation difference). In other words, it is determined that the target $j^{th}$ Gray code count summation difference within the correct range is the correct target $j^{th}$ Gray code count summation difference. The correct range may be determined based on the amount of read memory cells. For example, the amount of read memory cells is 18592*8. The number "18592" in "18592*8" may also be referred to a Gray code count predetermined value or a Gray code count average. More specifically, the correct range may be calculated based on the Gray code count predetermined value and a deviation. The deviation may be set in advance in the factory setting. Upper and lower boundaries of the correct range may be calculated based on "GRAY CODE COUNT PREDETERMINED VALUE*8±DEVIATION/NUMBER OF GRAY CODES". The value of the number of Gray codes may be set in correspondence with the maximum number of data bits of the data that each of the read target memory cells is capable of storing. Taking the TLC NAND flash memory module as an example, each memory cell may at most store three data bits. Thus, the corresponding number of Gray codes is 8, i.e., $2^3$. In other words, the value of the number of Gray codes may be determined in correspondence with the type of the memory module to which the target memory cell that is read belongs. For example, it is assumed that the Gray code count predetermined value corresponding to the size of a read space is 18592, the deviation is 6400, and the target memory cell that is read belongs to a TLC NAND flash memory module. Under the condition, the upper limit of the first correct range is (18592*8+6400)/8=19392, and the lower limit is (18592*8−6400)/8=17792. In other words, the correct range is 17792 to 19392.

As an example, it is assumed that the target first Gray code count summation differences lower than the optimization threshold among the total of X−1 first Gray code count summation differences $DL_{1,1}$, $DL_{2,1}$ ... $DL_{X-1,1}$ are the Gray code count summation difference $DL^{1,1}$ and the Gray code count summation difference $DL_{X-1,1}$. Regarding the Gray code count summation difference $DL_{1,1}$, the read voltage management circuit unit 215 (e.g., the read voltage optimization circuit 2152) may identify the Gray code count summation difference set DL(1) to which the Gray code count summation difference $DL_{1,1}$ belongs and the corresponding Gray code summation set SL(1) and the Gray code summation set SL(2), and identify the respective first Gray code counts, i.e., the Gray code count $C_{1,1}$ and the Gray code count $C_{2,1}$, of the Gray code summation set SL(1) and the Gray code summation set SL(2). Then, the read voltage management circuit unit 215 (e.g., the read voltage optimization circuit 2152) may determine whether one of the first Gray code count $C_{1,1}$ and the first Gray code count $C_{2,1}$ exceeds the correct range. If neither of the first Gray code count $C_{1,1}$ and the first Gray code count $C_{2,1}$ exceeds the correct range, the read voltage management circuit unit 215 (e.g., the read voltage optimization circuit 2152) may determine that the Gray code count summation difference $DL_{1,1}$ is the correct target first Gray code count summation difference. Alternatively, if one of the first Gray code count $C_{1,1}$ and the first Gray code count $C_{2,1}$ exceeds the correct range, the read voltage management circuit unit 215 (e.g., the read voltage optimization circuit 2152) may determine that the Gray code count summation difference $DL_{1,1}$ is the incorrect target first Gray code count summation difference. Similarly, regarding the Gray code count summation difference $DL_{X-1,1}$, the read voltage management circuit unit 215 (e.g., the read voltage optimization circuit 2152) may determine whether one of the first Gray code count $C_{X-1,1}$ and the first Gray code count $C_{X,1}$ exceeds the correct range.

Assuming that, in the example, the Gray code count summation difference $DL_{1,1}$ is the correct target first Gray code count summation difference, and the Gray code count summation difference $DL_{X-1,1}$ is the incorrect target first Gray code count summation difference, the read voltage management circuit unit 215 (e.g., the read voltage optimization circuit 2152) may choose the first Gray code count summation difference $DL_{1,1}$ as the optimized first Gray code count summation difference (j=1).

After obtaining the optimized $j^{th}$ Gray code count summation difference, the read voltage management circuit unit 215 (e.g., the read voltage optimization circuit 2152) may identify the Gray code count summation difference set to which the optimized $j^{th}$ Gray code count summation difference belongs as the $Y^{th}$ Gray code count summation difference set in the X-1 Gray code count summation difference sets. Then, the read voltage management circuit unit 215 (e.g., the read voltage optimization circuit 2152) may obtain the $j^{th}$ read voltage in the $Y^{th}$ read voltage set or the $j^{th}$ read voltage in the $Y+1^{th}$ read voltage set as $j^{th}$ optimized read voltage of the N-1 optimized read voltages in the optimized read voltage set, wherein Y is a positive integer less than or equal to X-1 and greater than or equal to 1.

For example, further to choosing the target first Gray code count summation difference $DL_{1,1}$ as the optimized first Gray code count summation difference in the example, the read voltage management circuit unit 215 (e.g., the read voltage optimization circuit 2152) may identify the Gray code count summation difference set DL(1) to which the optimized first Gray code count summation difference $DL_{1,1}$ belongs as the first Gray code count summation difference set of the X-1 Gray code count summation difference sets (i.e., Y=1), and the read voltage management circuit unit 215 (e.g., the read voltage optimization circuit 2152) may obtain one of the first read voltage R11 and the first read voltage R21 of the first read voltage set VR(1) and the second read voltage set VR(2) corresponding to the first Gray code count summation difference set DL(1) as the first optimized read voltage in the optimized read voltage set. In other words, the one of the first read voltage R11 and the first read voltage R21 is adapted as the optimized read voltage that is arranged first in the order from left to right in the optimized read voltage set.

In other words, pertaining to the sequence, the read voltage management circuit unit 215 may look for the target Gray code count summation differences corresponding to the position in the order that are lower than the optimization threshold, and may carry out the check operation to filter out the incorrect target Gray code count summation differences to obtain the correct target Gray code count summation differences and thereby obtain the optimized Gray code count summation difference corresponding to the position in the order (i.e., the optimized $j^{th}$ Gray code count summation difference). Then, the read voltage management circuit unit 215 may identify two read voltages corresponding to the position in the order in the two corresponding read voltage sets, and either of the read voltages may serve as the optimized voltage corresponding to the position in the order. In other words, either of the two read voltages corresponding to the target Gray code count summation difference whose value is small to a certain extent among the Gray code count summation differences may be adapted as the optimized read voltage. Taking the optimized read voltage arranged fifth in the order in FIG. 8A as an example, the Gray code count summation difference corresponding to the read voltage R15 and the read voltage R25 may be less than the Gray code count summation difference corresponding to the read voltage R25 and the read voltage R35 (i.e., the area of the threshold voltage distribution between the read voltage R15 and the read voltage R25 is smaller than the area of the threshold voltage distribution between the read voltage R25 and the read voltage R35). Under the condition, the read voltage R15 and the read voltage R25 corresponding to the smaller Gray code count summation difference may be a more suitable candidate as the optimized read voltage than the read voltage R25 and the read voltage R35 corresponding to the greater Gray code count summation difference, because the read voltage R15 and the read voltage R25 are closer to the interface between the threshold voltage distribution corresponding to the Gray code G5 and the threshold voltage distribution corresponding to the Gray code G6.

In the embodiment, the location of the optimized voltage is determined based on the idea that the optimized read voltage should be located at the interface between two threshold voltage distributions corresponding to two Gray codes and that the variation of the area at the interface may be less than a predetermined value (i.e., the optimization threshold). People having ordinary skills in the art may modify the method/operation for optimizing the read voltage of the embodiment based on the idea that the variation of the area at the interface between threshold voltage distributions may be less than a predetermined value. Nevertheless, such modification shall not be considered as departing from the spirit of the embodiments of the invention and shall remain within the scope of the embodiments of the invention. Compared with the conventional processes, the read voltage optimization method according to the embodiment only requires to read the target word line X*M times by using X read voltage sets (M is the number of bit values each memory cell is able to store). In other words, the optimized read voltage set of the target word line may be obtained after X*M read counts. However, the number of read counts required in the first conventional process is $(2^M-1)*X$ read counts. Taking a TLC flash memory (where one memory cell stores three bit values) as an example, a read voltage set has a total of seven read voltages corresponding to different voltage intervals. If the first conventional process is selected, the process requires to fix six read voltages and adjust one read voltage for reading. If each read voltage requires X times of adjustment, and the results need to be obtained through reading to find out the optimal one by comparing all the results, the number of read counts required to obtain the optimal read voltage is $(2^3-1)*X=7*X$. Besides, verified data are required for such conventional process. In other words, the first conventional process requires a large amount of computing resources (e.g., adjusting the read voltage and verifying corresponding read data) and storage space (e.g., the space for storing the verified data).

Regarding the difference in read counts, the decoding method provided in the embodiment significantly reduces the time and computation resources consumed for the read voltage optimization process and is still able to render the effectiveness and accuracy of the first conventional process.

Besides, compared with the second conventional process, the decoding method provided in the embodiment is able to utilize a greater number of the X read voltage sets. Therefore, the optimized read voltage obtained accordingly is more accurate than the read voltage obtained based on the second conventional process. The adjustment read voltage sets according to the second conventional process are fewer than the X read voltage sets provided in the present embodiment.

Compared with the higher chance of failure and the greater number of error bits in the data read based on the second conventional process, the decoding method provided in the embodiments of the invention is able to lower the chance of failure and reduce the greater number of error bits, as the method provided in the embodiments of the invention is able to achieve the accuracy of the first conventional process. Meanwhile, based on the quick read voltage screening operation and the subsequent read voltage optimization process according to the embodiments of the invention, the optimized read voltage set can be quickly and efficiently found. In other words, the decoding method and the storage controller according to the embodiments of the invention keep the advantages of the conventional processes, while alleviate the defects of the conventional processes.

In view of the foregoing, the decoding method and the storage controller according to the embodiments of the invention are capable of performing the read voltage optimization process corresponding to the target word line to any target word line without preparing verified data. In the read voltage optimization operation, the storage controller may quickly obtain the different read voltage sets having a smaller voltage range from the read voltage sets covering a broader range and adjust the read voltage sets to obtain the different Gray code count summation differences, so as to determine the optimized read voltages from the read voltages in the read voltage sets for forming the optimized read voltage set corresponding to the target word line. Accordingly, the accuracy of the read data and the overall efficiency of the read operation are facilitated.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A decoding method for a storage device comprising a rewritable non-volatile memory module, wherein the rewritable non-volatile memory module comprises a plurality of word lines, each of the word lines comprises a plurality of memory cells, each of the memory cells is programmed to store a bit value corresponding to one of a plurality of different Gray codes, a total number of the Gray codes is N, N is a first predetermined positive integer greater than 2, and the method comprises:

choosing a target word line of the word lines, wherein a plurality of target memory cells of the target word line are programmed;

respectively reading the target memory cells by using different X read voltage sets to obtain corresponding X Gray code summation sets, wherein X is a second predetermined positive integer, the X read voltage sets and the corresponding X Gray code summation sets are arranged based on a first predetermined order, a voltage difference between every pair of adjacent read voltage sets in the X read voltage sets is a first predetermined voltage difference, each of the X read voltage sets has N−1 read voltages arranged based on a second predetermined order, wherein each of the X Gray code summation sets has N−1 Gray code count summations arranged based on the second predetermined order, and a $j^{th}$ Gray code count summation in the N−1 Gray code count summations corresponds to a $j^{th}$ read voltage in the N−1 read voltages, wherein the $j^{th}$ Gray code count summation is calculated by summing up first j Gray code counts among N Gray code counts, wherein the N Gray code counts are calculated by summing up the numbers of a plurality of read bit values classified into the respective Gray codes, wherein the read bit values are obtained by using a corresponding read voltage set to read the target memory cells;

choosing every pair of adjacent Gray code summation sets in the X gray code summation sets based on the first predetermined order, and calculating a Gray code count summation difference of the Gray code count summations at the same sequence position in the respective N−1 Gray code count summations between every pair of adjacent Gray code summation sets based on the second predetermined order, so as to obtain X−1 Gray code count summation difference sets corresponding to all the chosen pairs of the Gray code summation sets, wherein each of the X−1 Gray code count summation difference sets comprises N−1 Gray code count summation differences arranged based on the second predetermined order, and a $j^{th}$ Gray code count summation difference in the N−1 Gray code count summation differences corresponds to the $j^{th}$ read voltage in the N−1 read voltages; and determining N−1 optimized read voltages corresponding to the second predetermined order from X*(N−1) read voltages belonging to the X read voltage sets based on the N−1 Gray code count summation differences of each of the X−1 Gray code count summation difference sets to form an optimized read voltage set corresponding to the target word line.

2. The decoding method as claimed in claim 1, further comprising:

performing a quick read voltage screening operation after choosing the target word line of the word lines to determine the X read voltage sets, wherein the quick read voltage screening operation comprises:

reading the target memory cells by using Z read voltage sets to obtain Z Gray code count sets respectively corresponding to the Z read voltage sets, wherein a voltage difference between every pair of adjacent read voltage sets of the Z read voltage sets is a second predetermined voltage difference, a value of Z is less than the second predetermined positive integer, and the second predetermined voltage difference is greater than the first predetermined voltage difference;

obtaining one of the Z read voltage sets as an initial reference read voltage set based on at least one of a first Gray code count and a last Gray code count of each of the Z Gray code count sets and a Gray code count predetermined value; and determining the X read voltage sets based on the initial reference read voltage sets, a first Gray code count deviation, the second predetermined positive integer, and the first predetermined voltage difference.

3. The decoding method as claimed in claim 1, wherein values of j include 1 to N−1 based on the second predetermined order, and respectively reading the target memory cells by using the different X read voltage sets to obtain the corresponding X Gray code summation sets comprises:
choosing an $i^{th}$ read voltage set of the X read voltage sets, wherein values of i include 1 to X based on the first predetermined order;
respectively reading the target memory cells by using N−1 read voltages of the $i^{th}$ read voltage set to obtain the read bit values corresponding to the $i^{th}$ read voltage set and classified into the Gray codes;
summing up the numbers of the read bit values classified into the respective Gray codes as the N Gray code counts corresponding to the $i^{th}$ read voltage set based on the obtained read bit values corresponding to the $i^{th}$ read voltage set and the Gray codes which the read bit values belong to, wherein the Gray code counts are arranged based on a third predetermined order; and
calculating N−1 Gray code count summations based on the N Gray code counts corresponding to the $i^{th}$ read voltage set and the second predetermined order, and obtaining the N−1 Gray code count summations as an $i^{th}$ Gray code summation set corresponding to the $i^{th}$ read voltage set in the X Gray code summation sets, wherein a value of a $j^{th}$ Gray code count summation in the N−1 Gray code count summations is a summation of the first j Gray code counts.

4. The decoding method as claimed in claim 3, wherein respectively reading the target memory cells by using the different X read voltage sets to obtain the corresponding X Gray code summation sets further comprises:
calculating the N−1 Gray code count summations in each of the X Gray code summation sets based on a formula as follows:

$$SL_{i,j} = \Sigma_{k=1}^{j} C_{i,k}, \forall i \in [1,X], \forall j \in [1,N-1]$$

wherein $SL_{i,j}$ represents the $j^{th}$ Gray code count summation in the $i^{th}$ Gray code summation set corresponding to the $i^{th}$ read voltage set, $C_{i,k}$ represents a $k^{th}$ Gray code count in the N Gray code counts corresponding to the $i^{th}$ read voltage set, wherein values of k include 1 to N−1 based on the second predetermined order.

5. The decoding method as claimed in claim 1, wherein choosing the every pair of adjacent Gray code summation sets in the X gray code summation sets based on the first predetermined order and calculating the Gray code count summation difference of the Gray code count summations at the same sequence position in the respective N−1 Gray code count summations between every chosen pair of two Gray code summation sets based on the second predetermined order to obtain the X−1 Gray code count summation difference sets corresponding to all the chosen pairs of the Gray code summation sets comprises:
choosing an $i^{th}$ Gray code summation set and an $i+1^{th}$ Gray code summation set from the X Gray code summation sets; and
calculating a difference between the $j^{th}$ Gray code count summation in the N−1 Gray code count summations of the $i+1^{th}$ Gray code summation set and the $j^{th}$ Gray code count summation in the N−1 Gray code count summations of the $i^{th}$ Gray code summation set based on the second predetermined order, and obtaining the difference as the $j^{th}$ Gray code count summation difference of the N−1 Gray code count summation differences in the $i^{th}$ Gray code count summation difference set of the X−1 Gray code count summation difference sets, wherein the $i^{th}$ Gray code count summation difference set corresponds to the $i^{th}$ read voltage set and the $i+1^{th}$ read voltage set, and the $j^{th}$ Gray code count summation difference in the $i^{th}$ Gray code count summation difference set corresponds to the $j^{th}$ read voltage in the $i^{th}$ read voltage set and the $j^{th}$ read voltage in the $i+1^{th}$ read voltage set.

6. The decoding method as claimed in claim 1, wherein determining the N−1 optimized read voltages corresponding to the second predetermined order from the X*(N−1) read voltages belonging to the X read voltage sets based on the N−1 Gray code count summation differences of each of the X−1 Gray code count summation difference sets to form the optimized read voltage set corresponding to the target word line comprises:
choosing the $j^{th}$ Gray code count summation difference from each of the X−1 Gray code count summation difference sets based on the second predetermined order to obtain X−1 $j^{th}$ Gray code count summation differences; and
deciding a $j^{th}$ optimized read voltage in the N−1 optimized read voltages of the optimized read voltage set based on the X−1 $j^{th}$ Gray code count summation differences.

7. The decoding method as claimed in claim 6, wherein deciding the $j^{th}$ optimized read voltage in the N−1 optimized read voltages of the optimized read voltage set based on the X−1 $j^{th}$ Gray code count summation differences comprises:
identifying a plurality of target $j^{th}$ Gray code count summation differences lower than an optimized threshold from the X−1 $j^{th}$ Gray code count summation differences;
performing a check operation to the target $j^{th}$ Gray code count summation differences to identify one or more incorrect $j^{th}$ Gray code count summation differences from the target $j^{th}$ Gray code count summation differences and choosing one of remaining one or more correct $j^{th}$ Gray code count summation differences of the target $j^{th}$ Gray code count summation differences as an optimized $j^{th}$ Gray code count summation difference;
obtaining the Gray code count summation difference set that the optimized $j^{th}$ Gray code count summation difference belongs to as a $Y^{th}$ Gray code count summation difference set of the X−1 Gray code count summation difference sets; and
obtaining the $j^{th}$ read voltage in a $Y^{th}$ read voltage set or the $j^{th}$ read voltage in a $Y+1^{th}$ read voltage set as the $j^{th}$ optimized read voltage in the N−1 optimized read voltages of the optimized read voltage set, wherein Y is a positive integer less than or equal to X−1 and is greater than or equal to 1.

8. The decoding method as claimed in claim 7, wherein performing the check operation to the target $j^{th}$ Gray code count summation differences to identify the one or more incorrect $j^{th}$ Gray code count summation differences from the target $j^{th}$ Gray code count summation differences comprises:
identifying the Gray code count summation difference set to which one of the target $j^{th}$ Gray code count summation differences belongs, and identifying the respective $j^{th}$ Gray code counts of two Gray code summation sets corresponding to the Gray code count summation difference set to which the target $j^{th}$ Gray code count summation difference belongs;
determining whether one of the two $j^{th}$ Gray code counts exceeds a correct range;

determining that the target $j^{th}$ Gray code count summation difference is an incorrect target $j^{th}$ Gray code count summation difference if one of the two $j^{th}$ Gray code counts exceeds the correct range; and determining that the target $j^{th}$ Gray code count summation difference is a correct target $j^{th}$ Gray code count summation difference if neither of the two $j^{th}$ Gray code counts exceeds the correct range.

9. The decoding method as claimed in claim 8, wherein the number of the target memory cells that are read is set in advance, and the correct range is set based on a size of a storage space for storing data of the target memory cells, wherein if the size of the storage space of the target memory cells is greater, the correct range is set to be greater, and if the size of the storage space of the target memory cells is smaller, the correct range is set to be smaller, and wherein the correct range is further adjusted based on a maximum number of data bits that each memory cell is able to store.

10. The decoding method as claimed in claim 1, wherein choosing the target word line of the word lines comprises:

choosing the target word line at a specific time point, wherein the specific time point meets one of the following:

when the storage device is idling for over a predetermined threshold of time;

when the storage device is turned on; and when the number of error bits of data read from a word line exceeds an error bit threshold, wherein the word line is set to be the target word line.

11. The decoding method as claimed in claim 1, further comprising:

identifying a plurality of statistical values of the target word line in response to choosing the target word line; and adjusting a size of the predetermined voltage difference and a value of the second predetermined positive integer based on at least one of the statistical values, wherein the statistical values comprise:

a value of program erase cycles of the target word line;

a read counter value of the target word line;

a retention time value of the target word line; and the number of error bits of data stored in the target word line.

12. The decoding method as claimed in claim 1, wherein values of j include 1 to N−1 based on the second predetermined order, and respectively reading the target memory cells by using the different X read voltage sets to obtain the corresponding X Gray code summation sets comprises:

choosing an $i^{th}$ read voltage set of the X read voltage sets, wherein values of i include 1 to X based on the first predetermined order;

respectively reading the target memory cells by using N−1 read voltages of the $i^{th}$ read voltage set to obtain the read bit values corresponding to the $i^{th}$ read voltage set and classified into the Gray codes;

summing up the numbers of the read bit values classified into the respective Gray codes as the N Gray code counts corresponding to the $i^{th}$ read voltage set based on the obtained read bit values corresponding to the $i^{th}$ read voltage set and the Gray codes which the read bit values belong to, wherein the Gray code counts are arranged based on a third predetermined order; and calculating N−1 Gray code count summations based on the N Gray code counts corresponding to the $i^{th}$ read voltage set and a fourth predetermined order, and obtaining the N−1 Gray code count summations as an $i^{th}$ Gray code summation set corresponding to the $i^{th}$ read voltage set in the X Gray code summation sets, wherein a value of a $j^{th}$ Gray code count summation in the N−1 Gray code count summations is a summation of last N−j Gray code counts and the fourth predetermined order is reverse of the second predetermined order.

13. The decoding method as claimed in claim 11, wherein respectively reading the target memory cells by using the different X read voltage sets to obtain the corresponding X Gray code summation sets further comprises:

calculating the N−1 Gray code count summations in each of the X Gray code summation sets based on a formula as follows:

$$SR_{i,j} = \Sigma_{k=j+1}^{N} C_{i,k}, \forall i \in [1,X], \forall j \in [1,N-1]$$

wherein $SR_{i,j}$ represents the $j^{th}$ Gray code count summation in the $i^{th}$ Gray code summation set corresponding to the $i^{th}$ read voltage set, $C_{i,k}$ represents a $k^{th}$ Gray code count in the N Gray code counts corresponding to the $i^{th}$ read voltage set, wherein values of k include N to 2 based on the fourth predetermined order.

14. A storage controller, controlling a storage device comprising a rewritable non-volatile memory module, the storage controller comprising:

a connection interface circuit, coupled to a host system;

a memory interface control circuit, coupled to the rewritable non-volatile memory module, wherein the rewritable non-volatile memory module comprises a plurality of word lines, each of the word lines comprises a plurality of memory cells, each of the memory cells is programmed to store a bit value corresponding to one of a plurality of different Gray codes, a total number of the Gray codes is N, and N is a first predetermined positive integer greater than 2;

a read voltage management circuit unit; and a processor, coupled to the connection interface circuit, the memory interface control circuit, and the read voltage management circuit unit, wherein the processor chooses a target word line of the word lines, instructs the read voltage management circuit unit to perform a read voltage optimization operation corresponding to the target word line, a plurality of target memory cells of the target word line are programmed, and wherein in the read voltage optimization operation:

the read voltage management circuit unit respectively reads the target memory cells by using different X read voltage sets to obtain corresponding X Gray code summation sets, wherein X is a second predetermined positive integer, the X read voltage sets and the corresponding X Gray code summation sets are arranged based on a first predetermined order, a voltage difference between every pair of adjacent read voltage sets in the X read voltage sets is a predetermined voltage difference, each of the X read voltage sets has N−1 read voltages arranged based on a second predetermined order, wherein each of the X Gray code summation sets has N−1 Gray code count summations arranged based on the second predetermined order, and a $j^{th}$ Gray code count summation in the N−1 Gray code count summations corresponds to a $j^{th}$ read voltage in the N−1 read voltages, wherein the $j^{th}$ Gray code count summation is calculated by summing up first j Gray code counts among N Gray code counts, wherein the N Gray code counts are calculated by summing up the numbers of a plurality of read bit values classified into the respective Gray codes, wherein the read bit values are obtained by using a corresponding read voltage set to read the target memory cells, wherein the read voltage management circuit unit further chooses every pair of adjacent Gray code summation sets in the X gray code summation sets based on the first predetermined order and calculates a Gray code count summation difference of the Gray code count summations at the same sequence position in the respective N−1 Gray code count summations between every chosen pair of two Gray code summation sets based on the second predetermined order to obtain X−1 Gray code count summation difference sets corresponding to all the chosen pairs of the Gray code summation sets, wherein each of the X−1 Gray code count summation difference sets comprises N−1 Gray code count summation differences arranged based on the second predetermined order, and a $j^{th}$ Gray code count summation difference in the N−1 Gray code count summation differences corresponds to the $j^{th}$ read voltage in the N−1 read voltages, and wherein the read voltage management circuit unit further determines N−1 optimized read voltages corresponding to the second predetermined order from X*(N−1) read voltages belonging to the X read voltage sets based on the N−1 Gray code count summation differences of each of the X−1 Gray code count summation difference sets to form an optimized read voltage set corresponding to the target word line and complete the read voltage optimization operation corresponding to the target word line.

15. The storage controller as claimed in claim 14, wherein:

the read voltage management circuit unit further performs a quick read voltage screening operation after the operation of choosing the target word line of the word lines to determine the X read voltage sets, wherein the quick read voltage screening operation comprises:

reading the target memory cells by using Z read voltage sets to obtain Z Gray code count sets respectively corresponding to the Z read voltage sets, wherein a voltage difference between every pair of adjacent read voltage sets of the Z read voltage sets is a second predetermined voltage difference, a value of Z is less than the second predetermined positive integer, and the second predetermined voltage difference is greater than the first predetermined voltage difference;

obtaining one of the Z read voltage sets as an initial reference read voltage set based on at least one of a first Gray code count and a last Gray code count of each of the Z Gray code count sets and a Gray code count predetermined value; and determining the X read voltage sets based on the initial reference read voltage sets, a first Gray code count deviation, the second predetermined positive integer, and the first predetermined voltage difference.

16. The storage controller as claimed in claim 14, wherein values of j include 1 to N−1 based on the second predetermined order, and in the operation of respectively reading the target memory cells by using the different X read voltage sets to obtain the corresponding X Gray code summation sets:

the read voltage management circuit unit chooses an $i^{th}$ read voltage set of the X read voltage sets, wherein values of i include 1 to X based on the first predetermined order, wherein the read voltage management circuit unit respectively reads the target memory cells by using N−1 read voltages of the $i^{th}$ read voltage set to obtain a plurality of read bit values corresponding to the $i^{th}$ read voltage set and classified into the Gray codes, wherein the read voltage management circuit sums up the numbers of the read bit values classified into the respective Gray codes as the N Gray code counts corresponding to the $i^{th}$ read voltage set based on the obtained read bit values corresponding to the $i^{th}$ read voltage set and the Gray codes which the read bit values belong to, wherein the Gray code counts are arranged based on a third predetermined order, and wherein the read voltage management circuit unit calculates N−1 Gray code count summations based on the N Gray code counts corresponding to the $i^{th}$ read voltage set and the second predetermined order, and obtains the N−1 Gray code count summations as an $i^{th}$ Gray code summation set corresponding to the $i^{th}$ read voltage set in the X Gray code summation sets, wherein a value of a $j^{th}$ Gray code count summation in the N−1 Gray code count summations is a summation of the first j Gray code counts.

17. The storage controller as claimed in claim 16, wherein in the operation of respectively reading the target memory cells by using the different X read voltage sets to obtain the corresponding X Gray code summation sets, the read voltage management circuit calculates the N−1 Gray code count summations in each of the X Gray code summation sets based on a formula as follows:

$$SL_{i,j} = \Sigma_{k=1}^{j} C_{i,k}, \forall i \in [1,X], \forall j \in [1,N-1]$$

wherein $SL_{i,j}$ represents the $j^{th}$ Gray code count summation in the $i^{th}$ Gray code summation set corresponding to the $i^{th}$ read voltage set, $C_{i,k}$ represents a $k^{th}$ Gray code count in the N Gray code counts corresponding to the $i^{th}$ read voltage set, wherein values of k include 1 to N−1 based on the second predetermined order.

18. The storage controller as claimed in claim 14, wherein in the operation of choosing the every pair of adjacent Gray code summation sets in the X gray code summation sets based on the first predetermined order and calculating the Gray code count summation difference of the Gray code count summations at the same sequence position in the respective N−1 Gray code count summations between every pair of adjacent Gray code summation sets based on the second predetermined order to obtain the X−1 Gray code count summation difference sets corresponding to all the chosen pairs of the Gray code summation sets, the read voltage management circuit unit chooses an $i^{th}$ Gray code summation set and an $i+1^{th}$ Gray code summation set from the X Gray code summation sets, wherein the read voltage management circuit unit calculates a difference between the $j^{th}$ Gray code count summation in the N−1 Gray code count summations of the $i+1^{th}$ Gray code summation set and the $j^{th}$ Gray code count summation in the N−1 Gray code count summations of the $i^{th}$ Gray code summation set based on the second predetermined order, and obtains the difference as the $j^{th}$ Gray code count summation difference of the N−1 Gray code count summation differences in the $i^{th}$ Gray code count summation difference set of the X−1 Gray code count summation difference sets, wherein the $i^{th}$ Gray code count summation difference set corresponds to the $i^{th}$ read voltage set and the $i+1^{th}$ read voltage set, and the $j^{th}$ Gray code count summation difference in the $i^{th}$ Gray code count summation difference set corresponds to the $j^{th}$ read voltage in the $i^{th}$ read voltage set and the $j^{th}$ read voltage in the $i+1^{th}$ read voltage set.

19. The storage controller as claimed in claim 14, wherein in the operation of determining the N−1 optimized read voltages corresponding to the second predetermined order from the X*(N−1) read voltages belonging to the X read voltage sets based on the N−1 Gray code count summation differences of each of the X−1 Gray code count summation difference sets to form the optimized read voltage set corresponding to the target word line, the read voltage management circuit unit chooses the $j^{th}$ Gray code count summation difference from each of the X−1 Gray code count summation difference sets based on the second predetermined order to obtain X−1 $j^{th}$ Gray code count summation differences, and wherein the read voltage management circuit unit decides a $j^{th}$ optimized read voltage in the N−1 optimized read voltages of the optimized read voltage set based on the X−1 $j^{th}$ Gray code count summation differences.

20. The storage controller as claimed in claim 19, wherein in the operation of deciding the $j^{th}$ optimized read voltage in the N−1 optimized read voltages of the optimized read voltage set based on the X−1 $j^{th}$ Gray code count summation differences, the read voltage management circuit unit identifies a plurality of target $j^{th}$ Gray code count summation differences lower than an optimized threshold from the X−1 $j^{th}$ Gray code count summation differences, wherein the read voltage management circuit unit performs a check operation to the target $j^{th}$ Gray code count summation differences to identify one or more incorrect $j^{th}$ Gray code count summation differences from the target $j^{th}$ Gray code count summation differences and chooses one of remaining one or more correct $j^{th}$ Gray code count summation differences of the target $j^{th}$ Gray code count differences as an optimized $j^{th}$ Gray code count summation difference, wherein the read voltage management circuit unit obtains the Gray code count summation difference set that the optimized $j^{th}$ Gray code count summation difference belongs to as a $Y^{th}$ Gray code count summation difference set of the X−1 Gray code count summation difference sets, and wherein the read voltage management circuit unit obtains the $j^{th}$ read voltage in a $Y^{th}$ read voltage set or the $j^{th}$ read voltage in a $Y+1^{th}$ read voltage set as the $j^{th}$ optimized read voltage in the N−1 optimized read voltages of the optimized read voltage set, wherein Y is a positive integer less than or equal to X−1 and is greater than or equal to 1.

21. The storage controller as claimed in claim 20, wherein in the operation of performing the check operation to the target $j^{th}$ Gray code count summation differences to identify the one or more incorrect $j^{th}$ Gray code count summation differences from the target $j^{th}$ Gray code count summation differences, the read voltage management circuit identifies the Gray code count summation difference set to which one of the target $j^{th}$ Gray code count summation differences belongs, and identifies the respective $j^{th}$ Gray code counts of two Gray code summation sets corresponding to the Gray code count summation difference set to which the target $j^{th}$ Gray code count summation difference belongs, wherein the read voltage management circuit unit determines whether one of the two $j^{th}$ Gray code counts exceeds a correct range, wherein the read voltage management circuit unit determines that the target $j^{th}$ Gray code count summation difference is an incorrect target $j^{th}$ Gray code count summation difference if one of the two $j^{th}$ Gray code counts exceeds the correct range, and wherein the read voltage management circuit unit determines that the target $j^{th}$ Gray code count summation difference is a correct target $j^{th}$ Gray code count summation difference if neither of the two $j^{th}$ Gray code counts exceeds the correct range.

22. The storage controller as claimed in claim 21, wherein the number of the target memory cells that are read is set in advance, and the correct range is set based on a size of a storage space for storing data of the target memory cells that are read, wherein if the size of the storage space of the target memory cells is greater, the correct range is set to be greater, and if the size of the storage space of the target memory cells is smaller, the correct range is set to be smaller, and wherein the correct range is further adjusted based on a maximum number of data bits that each memory cell is able to store.

23. The storage controller as claimed in claim 14, wherein in the operation of choosing the target word line of the word lines, the processor chooses the target word line at a specific time point, wherein the specific time point meets one of the following:
when the storage device is idling for over a predetermined threshold of time; and
when the number of error bits of data read from a word line exceeds an error bit threshold, wherein the word line is set to be the target word line.

24. The storage controller as claimed in claim 14, wherein in the read voltage optimization operation, the read voltage management circuit unit further identifies a plurality of statistical values of a target physical unit that the target word line belongs to in response to choosing the target word line, wherein the read voltage management circuit unit further adjusts a size of the predetermined voltage difference and a value of the second predetermined positive integer based on at least one of the statistical values of the target physical unit, wherein the statistical values comprise:
a value of program erase cycles of the target physical unit;
a read counter value of the target physical unit;
a retention time value of the target physical unit; and
the number of error bits of data stored in the target word line.

25. The storage controller as claimed in claim 14, wherein values of j include 1 to N−1 based on the second predetermined order, and in the operation of respectively reading the target memory cells by using the different X read voltage sets to obtain the corresponding X Gray code summation sets:

the read voltage management circuit unit chooses an $i^{th}$ read voltage set of the X read voltage sets, wherein values of i include 1 to X based on the first predetermined order, wherein the read voltage management circuit unit respectively reads the target memory cells by using N−1 read voltages of the $i^{th}$ read voltage set to obtain the read bit values corresponding to the $i^{th}$ read voltage set and classified into the Gray codes, wherein the read voltage management circuit sums up the numbers of the read bit values classified into the respective Gray codes as the N Gray code counts corresponding to the $i^{th}$ read voltage set based on the obtained read bit values corresponding to the $i^{th}$ read voltage set and the Gray codes which the read bit values belong to, wherein the Gray code counts are arranged based on a third predetermined order, and wherein the read voltage management circuit unit calculates N−1 Gray code count summations based on the N Gray code counts corresponding to the $i^{th}$ read voltage set and a fourth predetermined order, and obtains the N−1 Gray code count summations as an $i^{th}$ Gray code summation set corresponding to the $i^{th}$ read voltage set in the X Gray code summation sets, wherein a value of a $j^{th}$ Gray code count summation in the N−1 Gray code count summations is a summation of last N−j Gray code counts and the fourth predetermined order is reverse of the second predetermined order.

26. The storage controller as claimed in claim 25, wherein in the operation of respectively reading the target memory cells by using the different X read voltage sets to obtain the corresponding X Gray code summation sets, the read voltage management circuit calculates the N−1 Gray code count summations in each of the X Gray code summation sets based on a formula as follows:

$$SR_{i,j} = \Sigma_{k=j+1}^{N} C_{i,k}, \forall i \in [1,X], \forall j \in [1,N-1]$$

wherein $SR_{i,j}$ represents the $j^{th}$ Gray code count summation in the $i^{th}$ Gray code summation set corresponding to the $i^{th}$ read voltage set, $C_{i,k}$ represents a $k^{th}$ Gray code count in the N Gray code counts corresponding to the $i^{th}$ read voltage set, wherein values of k include N to 2 based on the fourth predetermined order.

* * * * *